United States Patent
Zhang et al.

(10) Patent No.: US 10,167,189 B2
(45) Date of Patent: Jan. 1, 2019

(54) STRESS ISOLATION PLATFORM FOR MEMS DEVICES

(71) Applicant: Analog Devices, Inc., Norwood, MA (US)

(72) Inventors: Xin Zhang, Acton, MA (US); Michael W. Judy, Ipswich, MA (US); George M. Molnar, Westford, MA (US); Christopher Needham, Wenham, MA (US); Kemiao Jia, Tolland, CT (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 14/502,475

(22) Filed: Sep. 30, 2014

(65) Prior Publication Data

US 2016/0090297 A1    Mar. 31, 2016

(51) Int. Cl.
*H01L 21/00* (2006.01)
*B81B 7/00* (2006.01)

(52) U.S. Cl.
CPC ................................. *B81B 7/0048* (2013.01)

(58) Field of Classification Search
USPC .......................... 257/418, 417, 415, 253, 254
See application file for complete search history.

(56) References Cited

U.S. PATENT DOCUMENTS

| | | | |
|---|---|---|---|
| 3,839,660 A | 10/1974 | Stryker | 357/67 |
| 4,492,825 A | 1/1985 | Brzezinski et al. | 179/111 |
| 4,524,247 A | 6/1985 | Lindenberger et al. | 179/111 |
| 4,533,795 A | 8/1985 | Baumhauer, Jr. et al. | 179/111 |
| 4,558,184 A | 12/1985 | Busch-Vishniac et al. | 179/111 |
| 4,710,744 A | 12/1987 | Wamstad | 338/4 |
| 4,740,410 A | 4/1988 | Muller et al. | 428/133 |
| 4,744,863 A | 5/1988 | Guckel et al. | 156/653 |
| 4,776,019 A | 10/1988 | Miyatake | 381/174 |
| 4,800,758 A | 1/1989 | Knecht et al. | 73/727 |
| 4,825,335 A | 4/1989 | Wilner | 361/283 |
| 4,853,669 A | 8/1989 | Guckel et al. | 338/4 |
| 4,872,047 A | 10/1989 | Fister et al. | 357/67 |
| 4,918,032 A | 4/1990 | Jain et al. | 437/228 |
| 4,948,757 A | 8/1990 | Jain et al. | 437/240 |
| 4,996,082 A | 2/1991 | Guckel et al. | 427/99 |
| 5,067,007 A | 11/1991 | Otsuka et al. | 357/74 |
| 5,090,254 A | 2/1992 | Guckel et al. | 73/862.59 |
| 5,105,258 A | 4/1992 | Silvis et al. | 257/748 |

(Continued)

FOREIGN PATENT DOCUMENTS

| | | | | |
|---|---|---|---|---|
| EP | 0 788 157 A2 | 8/1997 | | H01L 23/495 |
| JP | 60-077434 A | 5/1985 | | H01L 21/58 |

(Continued)

OTHER PUBLICATIONS

USPTO, Non Final Office Action, U.S. Appl. No. 13/757,217, 20 pages, dated Jul. 2, 2014.

(Continued)

*Primary Examiner* — Timor Karimy
(74) *Attorney, Agent, or Firm* — Wolf, Greenfield & Sacks, P.C.

(57) ABSTRACT

A MEMS product includes a stress-isolated MEMS platform surrounded by a stress-relief gap and suspended from a substrate. The stress-relief gap provides a barrier against the transmission of mechanical stress from the substrate to the platform.

20 Claims, 23 Drawing Sheets

(56) References Cited

U.S. PATENT DOCUMENTS

| | | | |
|---|---|---|---|
| 5,113,466 A | 5/1992 | Acarlar et al. | 385/88 |
| 5,146,435 A | 9/1992 | Bernstein | 367/181 |
| 5,172,213 A | 12/1992 | Zimmerman | 257/796 |
| 5,178,015 A | 1/1993 | Loeppert et al. | 73/718 |
| 5,188,983 A | 2/1993 | Guckel et al. | 437/209 |
| 5,207,102 A | 5/1993 | Takahashi et al. | 73/727 |
| 5,241,133 A | 8/1993 | Mullen, III et al. | 174/52.4 |
| 5,273,939 A | 12/1993 | Becker et al. | 437/209 |
| 5,303,210 A | 4/1994 | Bernstein | 367/181 |
| 5,314,572 A | 5/1994 | Core et al. | 156/643 |
| 5,315,155 A | 5/1994 | O'Donnelly et al. | 257/711 |
| 5,317,107 A | 5/1994 | Osorio | 174/52.4 |
| 5,336,928 A | 8/1994 | Neugebauer et al. | 257/758 |
| 5,452,268 A | 9/1995 | Bernstein | 367/181 |
| 5,468,999 A | 11/1995 | Lin et al. | 257/784 |
| 5,490,220 A | 2/1996 | Loeppert | 381/168 |
| 5,515,732 A | 5/1996 | Willcox et al. | 73/724 |
| 5,593,926 A | 1/1997 | Fujihira | 437/209 |
| 5,596,222 A | 1/1997 | Bernstein | 257/620 |
| 5,608,265 A | 3/1997 | Kitano et al. | 257/738 |
| 5,629,566 A | 5/1997 | Doi et al. | 257/789 |
| 5,633,552 A | 5/1997 | Lee et al. | 310/311 |
| 5,658,710 A | 8/1997 | Neukermans | 430/320 |
| 5,684,324 A | 11/1997 | Bernstein | 257/415 |
| 5,692,060 A | 11/1997 | Wickstrom | 381/169 |
| 5,740,261 A | 4/1998 | Loeppert et al. | 381/168 |
| 5,828,127 A | 10/1998 | Yamagata et al. | 257/706 |
| 5,870,482 A | 2/1999 | Loeppert et al. | 381/174 |
| 5,901,046 A | 5/1999 | Ohta et al. | 361/760 |
| 5,923,995 A | 7/1999 | Kao et al. | 438/460 |
| 5,939,633 A | 8/1999 | Judy | 73/514.32 |
| 5,945,605 A | 8/1999 | Julian et al. | 73/727 |
| 5,956,292 A | 9/1999 | Bernstein | 367/140 |
| 5,960,093 A | 9/1999 | Miller | 381/324 |
| 5,994,161 A | 11/1999 | Bitko et al. | 438/53 |
| 6,084,292 A | 7/2000 | Shinohara | 257/676 |
| 6,128,961 A | 10/2000 | Haronian | 73/774 |
| 6,169,328 B1 | 1/2001 | Mitchell et al. | 257/778 |
| 6,243,474 B1 | 6/2001 | Tai et al. | 381/174 |
| 6,249,075 B1 | 6/2001 | Bishop et al. | 310/338 |
| 6,309,915 B1 | 10/2001 | Distefano | 438/127 |
| 6,329,706 B1 | 12/2001 | Nam | 257/666 |
| 6,384,472 B1 | 5/2002 | Huang | 257/680 |
| 6,384,473 B1 | 5/2002 | Peterson et al. | 257/680 |
| 6,401,545 B1 | 6/2002 | Monk et al. | 73/756 |
| 6,433,401 B1 | 8/2002 | Clark et al. | 257/524 |
| 6,505,511 B1 | 1/2003 | Geen et al. | 73/504.12 |
| 6,522,762 B1 | 2/2003 | Mullenborn et al. | 381/174 |
| 6,535,460 B2 | 3/2003 | Loeppert et al. | 367/181 |
| 6,548,895 B1 | 4/2003 | Benavides et al. | 257/712 |
| 6,552,469 B1 | 4/2003 | Pederson et al. | 310/309 |
| 6,617,683 B2 | 9/2003 | Lebonheur et al. | 257/707 |
| 6,667,189 B1 | 12/2003 | Wang et al. | 438/53 |
| 6,667,557 B2 | 12/2003 | Alcoe et al. | 257/778 |
| 6,677,176 B2 | 1/2004 | Wong et al. | 438/50 |
| 6,704,427 B2 | 3/2004 | Kearey | 381/355 |
| 6,711,317 B2 | 3/2004 | Jin et al. | 385/18 |
| 6,731,180 B1 | 5/2004 | Clark et al. | |
| 6,732,588 B1 | 5/2004 | Mullenborn et al. | 73/715 |
| 6,741,709 B2 | 5/2004 | Kay et al. | 381/175 |
| 6,753,583 B2 | 6/2004 | Stoffel et al. | 257/416 |
| 6,768,196 B2 | 7/2004 | Harney et al. | 257/729 |
| 6,781,231 B2 | 8/2004 | Minervini | 257/704 |
| 6,812,620 B2 | 11/2004 | Scheeper et al. | 310/324 |
| 6,816,301 B1 | 11/2004 | Schiller | 359/290 |
| 6,821,819 B1 | 11/2004 | Benavides et al. | 438/122 |
| 6,829,131 B1 | 12/2004 | Loeb et al. | 361/234 |
| 6,847,090 B2 | 1/2005 | Loeppert | 257/418 |
| 6,857,312 B2 | 2/2005 | Choe et al. | 73/170.13 |
| 6,859,542 B2 | 2/2005 | Johannsen et al. | 381/174 |
| 6,914,992 B1 | 7/2005 | van Halteren et al. | 381/113 |
| 6,955,988 B2 | 10/2005 | Nevin et al. | 438/700 |
| 6,984,886 B2 | 1/2006 | Ahn et al. | 257/698 |
| 7,066,004 B1 | 6/2006 | Kohler | 73/1.38 |
| 7,088,032 B2 | 8/2006 | Oita et al. | |
| 7,166,911 B2 | 1/2007 | Karpman et al. | 257/711 |
| 7,215,213 B2 | 5/2007 | Mescher et al. | |
| 7,268,463 B2 | 9/2007 | Li et al. | 310/209 |
| 7,309,865 B2 | 12/2007 | Ikushima et al. | |
| 7,551,048 B2 | 6/2009 | Iwata et al. | 335/78 |
| 7,839,052 B2 | 11/2010 | Wu et al. | 310/321 |
| 7,871,865 B2 | 1/2011 | Sengupta et al. | 438/126 |
| 8,049,326 B2 | 11/2011 | Najafi et al. | |
| 8,103,027 B2* | 1/2012 | Zhang | H04R 1/222 381/175 |
| 8,217,474 B2* | 7/2012 | Lee | B81C 1/00246 257/254 |
| 8,344,487 B2 | 1/2013 | Zhang et al. | 257/669 |
| 8,476,737 B2 | 7/2013 | Najafi et al. | |
| 8,698,292 B2 | 4/2014 | Najafi et al. | |
| 8,906,730 B2 | 12/2014 | Graham et al. | 438/53 |
| 9,227,835 B2 | 1/2016 | Horning et al. | |
| 9,422,156 B2 | 8/2016 | Smeys | B81C 1/100238 |
| 2001/0055836 A1 | 12/2001 | Kunda | 438/108 |
| 2002/0102004 A1 | 8/2002 | Minervini | 381/175 |
| 2002/0125559 A1 | 9/2002 | Mclellan | |
| 2003/0016839 A1 | 1/2003 | Loeppert et al. | 381/174 |
| 2003/0133588 A1 | 7/2003 | Pedersen | 381/423 |
| 2003/0189222 A1 | 10/2003 | Itou et al. | 257/200 |
| 2004/0041254 A1 | 3/2004 | Long et al. | 257/703 |
| 2004/0056337 A1 | 3/2004 | Hasebe et al. | 257/667 |
| 2004/0179705 A1 | 9/2004 | Wang et al. | 381/175 |
| 2004/0184632 A1 | 9/2004 | Minervini | 381/355 |
| 2004/0184633 A1 | 9/2004 | Kay et al. | 381/355 |
| 2004/0262781 A1 | 12/2004 | Germain et al. | 257/787 |
| 2005/0005421 A1 | 1/2005 | Wang et al. | 29/594 |
| 2005/0018864 A1 | 1/2005 | Minervini | 381/175 |
| 2005/0089188 A1 | 4/2005 | Feng | 381/396 |
| 2005/0093117 A1 | 5/2005 | Masuda et al. | 257/676 |
| 2005/0178208 A1 | 8/2005 | Benzel et al. | 73/715 |
| 2006/0246630 A1 | 11/2006 | Sunohara et al. | 438/125 |
| 2007/0040231 A1 | 2/2007 | Harney et al. | 257/415 |
| 2007/0042521 A1* | 2/2007 | Yama | B81C 1/00333 438/48 |
| 2008/0290430 A1 | 11/2008 | Mahadevan et al. | |
| 2011/0127623 A1 | 6/2011 | Fueldner et al. | 257/416 |
| 2011/0165717 A1 | 7/2011 | Lee et al. | 438/50 |
| 2012/0049298 A1 | 3/2012 | Schlarmann et al. | 257/415 |
| 2012/0068278 A1* | 3/2012 | Knipe | H01H 1/0036 257/418 |
| 2012/0248552 A1 | 10/2012 | Benzel | |
| 2012/0264250 A1 | 10/2012 | Graham et al. | 438/53 |
| 2014/0217521 A1 | 8/2014 | Johari-Galle et al. | 257/415 |
| 2014/0339656 A1 | 11/2014 | Schlarmann | |
| 2014/0353772 A1 | 12/2014 | Stermer, Jr. et al. | 257/415 |
| 2015/0197419 A1 | 7/2015 | Cheng | |
| 2016/0090297 A1 | 3/2016 | Zhang et al. | B81B 7/0019 |
| 2016/0159641 A1 | 6/2016 | Najafi et al. | |
| 2016/0229668 A1 | 8/2016 | Gu et al. | B81B 7/0048 |
| 2017/0073218 A1 | 3/2017 | Kaanta et al. | |
| 2017/0122976 A1 | 5/2017 | Mitchell et al. | |
| 2018/0230005 A1 | 8/2018 | Lee et al. | |

FOREIGN PATENT DOCUMENTS

| | | | | |
|---|---|---|---|---|
| JP | 62-241355 A | 10/1987 | | H01L 23/04 |
| JP | 05-226501 A | 9/1993 | | H01L 23/12 |
| JP | 07-142518 A | 6/1995 | | H01L 21/52 |
| JP | 08-116007 A | 5/1996 | | H01L 23/48 |
| WO | WO 83/01362 | 4/1983 | | H04R 1/06 |
| WO | WO 91/05368 A | 4/1991 | | H01L 23/13 |
| WO | WO 01/20948 | 3/2001 | | H04R 1/00 |
| WO | WO 02/45463 | 6/2002 | | H04R 19/00 |
| WO | WO 2004/022477 | 3/2004 | | B81B 7/00 |
| WO | WO 2005/036698 | 4/2005 | | |
| WO | WO 2007/030345 A2 | 3/2007 | | H01L 23/495 |
| WO | WO 2012/037537 A2 | 3/2010 | | B81B 7/04 |
| WO | WO 2016/112463 A1 | 7/2016 | | B81B 7/02 |

OTHER PUBLICATIONS

USPTO, Final Office Action, U.S. Appl. No. 13/757,217, 10 pages, dated Feb. 27, 2015.

(56) References Cited

OTHER PUBLICATIONS

Sunstein Kann Murphy & Timbers, LLP, Response to Office Action dated Jul. 2, 2014—U.S. Appl. No. 13/757,217, filed Dec. 20, 2014, 29 pages.
Sunstein Kann Murphy & Timbers, LLP, Request for Continued Examination (RCE)—U.S. Appl. No. 13/757,217, filed Aug. 27, 2015, 13 pages.
Sunstein Kann Murphy & Timbers, LLP, Response to Notice of Non-Compliant Amendment dated Mar. 11, 2016—U.S. Appl. No. 13/757,217, filed Jun. 17, 2016, 8 pages.
USPTO, Office Action—U.S. Appl. No. 13/757,217, dated Jun. 27, 2016, 30 pages.
Unknown, *Microphone industry to expand MEMS-based offerings*, The Information Network, online <www.theinformationnet.com>, printed Feb. 1, 2005, Nov. 14, 2003, 2 pages.
Unknown, *Phone-Or/Technology*, online <file://C:\Documents% 20and%20Settings\bmansfield\Local%20Settings\Temporary%20- Internet%20Files\OLKE\Phone-Or%20% . . . >, printed Feb. 1, 2005, 2 pages.
Unknown, *Liquid Crystal Polymer (LCP) Air Cavity Packages*, Quantum Leap Packaging, Inc., Brochure, 2004, 2 pages.
Bajdechi et al., *Single-Chip Low-Voltage Analog-to-Digital Interface for Encapsulation with Electret Microphone*, The 11th International Conference on Solid-State Sensors and Actuators, Jun. 10-14, 2001, 4 pages.
Bernstein, *MEMS Air Acoustics Research*, The Charles Stark Draper Laboratory, PowerPoint Presentation, Aug. 1999, 8 pages.
Bernstein et al., *High Sensitivity MEMS Ultrasound Arrays by Lateral Ferroelectric Polarization*, Solid-State Sensor and Actuator Workshop, Hilton Head Island, South Carolina, Jun. 4-8, 2000, 4 pages.
Blackwell, *The Electronic Packaging Handbook*, CRC Press LLC, pp. 2-3, 7-1, 7-12, A-9, and A-11, 2000.
Brown, William D. (Ed.), *Advanced Electronic Packaging with Emphasis on Multichip Modules*, Institute of Electrical and Electronics Engineers, Inc., pp. 4-8, 568, 1999.
Chen et al., *Single-Chip Condenser Miniature Microphone with a High Sensitive Circular Corrugated Diaphragm*, IEEE, 2002, 4 pages.
Cunningham et al., *Wide bandwidth silicon nitride membrane microphones*, SPIE vol. 3223, Sep. 1997, 9 pages.
Department of Defense, *Test Method Standard Microcircuits*, FSC 5962, completed 1997.
Fan et al., *Development of Artificial Lateral-Line Flow Sensors*, Solid-State Sensor, Actuator and Microsystems Workshop, Jun. 2-6, 2002, 4 pages.
Fuldner et al., *Silicon Microphones with Low Stress Membranes*, The 11th International Conference on Solid-State Sensors and Actuators, Jun. 10-14, 2001, 4 pages.
Gale et al., *MEMS Packaging*, University of Utah, Microsystems Principles, PowerPoint Presentation, Oct. 11, 2001, 8 pages.
Hall et al., *Self-Calibrating Micromachined Microphones with Integrated Optical Displacement Detection*, The 11th International Conference on Solid State Sensors and Actuators, Jun. 10-14, 2001, 4 pages.
Harper (Editor-in-Chief), *Electronic Packaging and Interconnection Handbook*, Third Edition, McGraw-Hill, Chapter 7, Section 7.2.3.1, 2000, 7 pages.
Heuberger, *Mikromechanik*, Springer Verlang A.G., pp. 470-476, 1989 (With translation).
Hsieh et al., *A Micromachined Thin-film Teflon Electret Microphone*, Department of Electrical Engineering California Institute of Technology, 1997, 4 pages.
Judy, *Microelectromechanical systems (MEMS): fabrication, design and applications*, Electrical Engineering Department, Institute of Physics Publishing, Smart Materials and Structures, vol. 10, pp. 1115-1134 Nov. 26, 2001.
Kabir et al., *High Sensitivity Acoustic Transducers with Thin P+ Membranes and Gold Back-Plate*, Sensors and Actuators, vol. 78, Issue 2-3, Dec. 17, 1999, 17 pages.
Ko et al., *Piezoelectric Membrane Acoustic Devices*, IEEE, 2002, 4 pages.
Kopola et al., *MEMS Sensor Packaging Using LTCC Substrate Technology*, VTT Electronics, Proceedings of SPIE vol. 4592, 2001, pp. 148-158.
Ma et al., *Design and Fabrication of an Integrated Programmable Floating-Gate Microphone*, IEEE, 2002, 4 pages.
Mason, *Companies Compete to Be Heard on the Increasingly Noisy MEMS Phone Market*, Small Times: News about MEMS, Nanotechnology and Microsystems, Jul. 18, 2003, 4 pages.
Maxim Integrated Products, *Electret Condenser Microphone Cartridge Preamplifier*, Maxim Integrated Products, Jul. 2002, 9 pages.
Neumann, Jr. et al., *A Fully-Integrated CMOS-MEMS Audio Microphone*, The 12th International Conference on Solid State Sensors, Actuators and Microsystems Jun. 8-12, 2003, 4 pages.
Ono et al., *Design and Experiments of Bio-mimicry Sound Source Localization Sensor with Gimbal-Supported Circular Diaphragm*, The 12th International Conference on Solid State Sensors, Actuators and Microsystems, Jun. 8-12, 2003, 4 pages.
Pecht, Michael (Ed.), *Handbook of Electronic Package Design*, Marcel Dekker, Inc. pp. 173, 179, 196, 210, 736, 744, 821 and 832, 1991.
Pedersen et al., *A Polymer Condenser Microphone on Silicon with On-Chip CMOS Amplifier*, Solid State Sensors and Actuators, 1997, 3 pages.
Prismark Partners, *The Prismark Wireless Technology Report—Mar. 2005*, Prismark Partners LLC, www.prismark.com, 13 pages.
Rugg et al., *Thermal Package Enhancement Improves Hard Disk Drive Data Transfer Performance*, Pan Pacific Microelectronics Symposium, Proceedings of the Technical Program, Island of Maui, Hawaii, Feb. 5-7, 2002, pp. 451-456.
Schafer et al., *Micromachined Condenser Microphone for Hearing Aid Use*, Solid-State Sensor and Actuator Workshop, Jun. 8-11, 1998, 4 pages.
Sheplak et al., *A Wafer-Bonded, Silicon-Nitride Membrane Microphone with Dielectrically Isolated, Single-Crystal Silicon Piezoresistors*, Solid-State Sensor and Actuator Workshop, Jun. 8-11, 1998, 4 pages.
Stahl, et al., *Thin Film Encapsulation of Acceleration Sensors Using Polysilicon Sacrificial Layer*, Transducers '03, The 12th International Conference on Solid State Sensors, Actuators and Microsystems, Jun. 8-12, 2003, 4 pages.
Tilmans et al., *The indent reflow sealing (IRS) technique—a method for the fabrication of sealed cavities for MEMS devices*, IEEE, Journal of Microelectro-mechanical Systems, vol. 9, Issue 2, pp. 206-217, Jul. 2000 (Abstract only—3 pages).
Tummala, Rao R. et al. (Eds.), *Microelectronics Packaging Handbook, Semiconductor Packaging Part II*, Second Edition, Chapman & Hall, pp. 11-12, 1997.
Weigold et al., *A MEMS Condenser Microphone for Consumer Applications*, in Proceedings IEEE, International Conference on MEMS 2006, Istanbul, Turkey, Jan. 2006, pp. 86-89.
Yovcheva et al., *Investigation on Surface Potential Decay in PP Corona Electrets*, BPU-5: Fifth General Conference of the Balkan Physical Union, Aug. 25-29, 2003, 4 pages.
Zou et al., *A Novel Integrated Silicon Capacitive Microphone—Floating Electrode "Electret" Microphone (FEEM)*, Journal of Microelectromechanical Systems, vol. 7, No. 2, Jun. 1998, 11 pages.

* cited by examiner

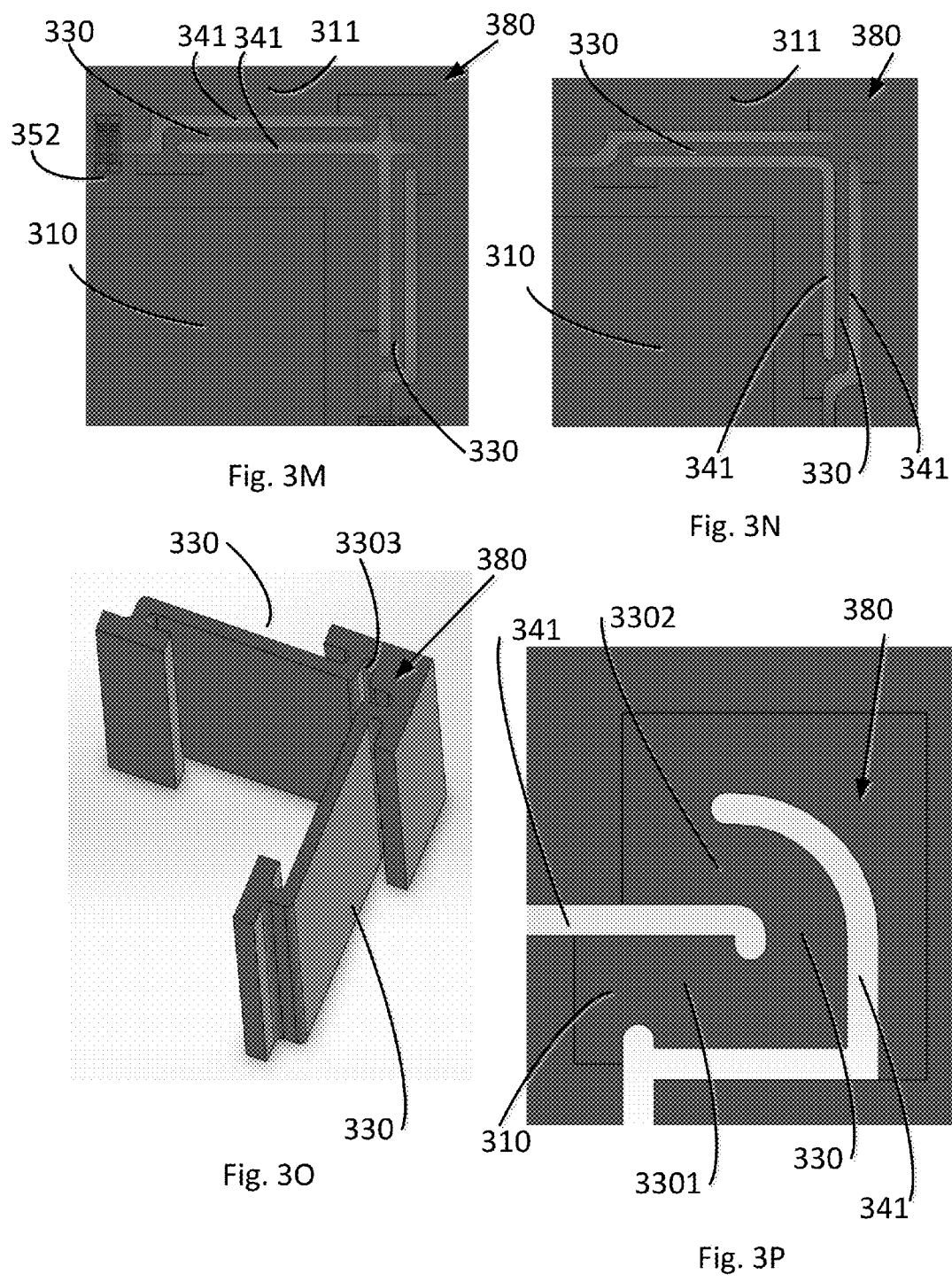

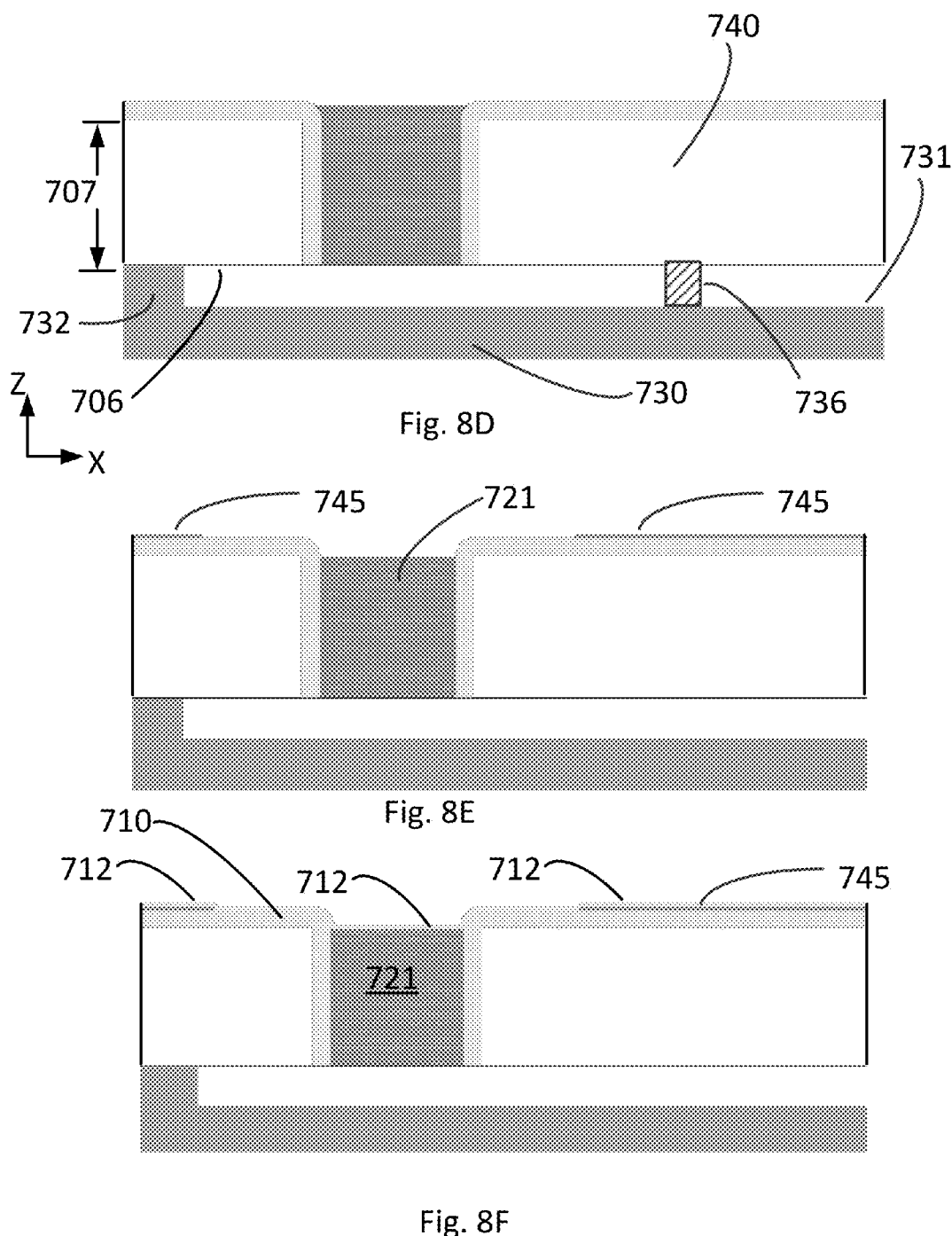

STRESS ISOLATION PLATFORM FOR MEMS DEVICES

TECHNICAL FIELD

The present invention relates to MEMS devices, and more particularly to structures for MEMS devices.

BACKGROUND ART

It is known in the prior art to package a micromachined (or "MEMS") device in a cavity package. Cavity packages are attractive for MEMS devices because they include an internal "cavity" that encloses the MEMS device without physically contacting or restraining a moveable portion of the MEMS device. The cavity area mainly protects the MEMS device from external stresses originating from thermal, torque and pressure loads. Although cavity packages are significantly reliable, they suffer from high cost.

Overmold packaging, while common for packaging non-micromachined integrated circuits, has presented challenges to MEMS packaging. The process of encapsulating a MEMS device may involve physical and thermal shock to the MEMS device. In addition, the overmold material properties widely change with temperature. In the case of a silicon-based MEMS device encapsulated in plastic overmold, this includes both the plastic's stiffness and thermal expansion coefficient, which are largely different from the corresponding properties of silicon. As a result, thermal stresses in the package due to the wide operational temperature, which may range for example from 175 C to −40 C, create large stresses that physically propagate through the structures in the MEMS sensor, and may cause performance problems, such as large offset drift of these sensors over the temperature.

SUMMARY OF THE EMBODIMENTS

In a first embodiment of the invention there is provided a MEMS device have a MEMS platform suspended within a substrate layer to define a stress-relief gap between the platform and the substrate. The stress-relief gap provides a barrier against the transmission of mechanical stress from the substrate to the platform.

For example, in one embodiment, the MEMS device includes a substrate layer having a substrate. Suspended within the substrate layer is a MEMS platform. The MEMS platform may be the same material as the substrate layer (e.g., a semiconductor such as silicon). For example, the MEMS platform may be etched from the substrate layer.

The MEMS platform is suspended in such a way as to define a stress-relief gap between the MEMS platform and the substrate. The substrate may contain at least one bridge (i.e., one or more bridges) spanning the stress-relief gap and configured to rigidly suspend the MEMS platform within the substrate. The bridges may be the same material as the substrate layer (e.g., a semiconductor such as silicon). For example, a bridge may be etched from the substrate layer. Alternately, or in addition, in some embodiments, the MEMS device may include at least one pillar (i.e., one or more pillars) spanning the stress-relief gap and configured to rigidly suspend the MEMS platform within the substrate.

The MEMS device also includes a MEMS device layer that includes a MEMS structure movably suspended from the MEMS platform by at least one flexure. The MEMS device also includes at least one flexible electrical conductor electrically coupled to the MEMS structure on the MEMS platform. The at least one flexible electrical conductor spans the stress-relief gap between the substrate and the MEMS platform, and is configured to carry an electrical signal across the stress-relief gap.

In some embodiments, the MEMS device layer has a peripheral region circumscribing the stress-relief gap, and a top cap coupled to the peripheral region such that the MEMS platform is disposed between the top cap and the bottom cap, and defining a top void between the top cap and the MEMS platform. Some embodiments also have a bottom cap coupled to the substrate and defining a bottom void between the bottom cap and the MEMS platform.

In another embodiment, a MEMS device has a substrate and a MEMS platform suspended within the substrate and defining a stress-relief gap circumscribing the MEMS platform in every direction. The device also includes a MEMS structure on the MEMS platform, the MEMS structure. The MEMS structure has a member movably suspended from the MEMS platform by at least one flexure.

The MEMS platform is rigidly suspended within the substrate by a suspension means, and an electrical conductor means spans the stress-relief gap, and is configured to carry an electrical signal across the stress-relief gap. For example, the suspension means may include one or more pedestals extending between the bottom cap and the MEMS platform. The electrical conductor means may include at least one conductive jumper spanning the stress-relief gap.

In some embodiments the substrate has a peripheral region circumscribing the stress-relief gap, and a bottom cap coupled to the peripheral region and defining a bottom void between the bottom cap and the MEMS platform, as well as a top cap coupled to the substrate such that the MEMS platform is disposed between the top cap and the bottom cap, and defining a top void between the top cap and the MEMS platform.

In one embodiment, a MEMS device does not include bridges at all. For example, such a MEMS device includes a substrate; a MEMS platform within the substrate layer and defining a bridge-free stress-relief gap between the MEMS platform and the substrate; a MEMS structure on the MEMS platform, the MEMS structure having a member movably suspended from the MEMS platform by at least one flexure; at least one flexible electrical conductive electrically coupled to a MEMS structure on the MEMS platform, and spanning the stress-relief gap between the substrate and the MEMS platform, the flexible electrical conductor configured to carry an electrical signal across the stress-relief gap; a bottom cap coupled to the substrate and defining a bottom void between the bottom cap and the MEMS platform; a top cap coupled to the substrate such that the MEMS platform is disposed between the top cap and the bottom cap, and defining a top void between the top cap and the MEMS platform; and at least one pillar physically coupled to the bottom cap and the MEMS platform, and configured to support the MEMS platform without bridges spanning the stress-relief gap.

In various embodiments, the bridges may take any of a variety of configurations, such as a Z-shaped bridge, an L-shaped bridge, or a U-shaped bridge, for example. For example, a bridge may include a first segment extending from the substrate in the direction of the MEMS platform, a second segment extending from, and disposed at an angle to, the first segment, and a third segment extending from, and disposed at an angle to, the second segment, and coupled to the MEMS platform.

In some embodiments, the electrical conductor may be a jumper. In some embodiments, the electrical conductor is on, or part of, at least one bridge.

An embodiment of a method of fabricating a MEMS device includes providing a substrate and fabricating a stress-relief gap through the substrate and defining a MEMS platform, the gap circumscribing the MEMS platform in every direction, as well as fabricating a MEMS structure on the MEMS platform.

In some embodiments, the MEMS structure is fabricated before the fabrication of the stress-relief gap. Indeed, in some embodiments, the MEMS structure is fabricated before the fabrication of the stress-relief gap, and the fabrication of the MEMS structure includes fabricating a MEMS structure, immobilizing the MEMS structure relative to the substrate, etching a stress-relief gap through the substrate and defining a MEMS platform surrounding the MEMS structure; and releasing the MEMS structure. In other embodiments, the MEMS structure is fabricated after the fabrication of the stress-relief gap.

In some embodiments, providing a substrate includes providing a substrate having a first side and a second side, and the process of fabricating a stress-relief gap and fabricating a MEMS structure includes etching a trench extending into the first side of the substrate and extending partially through the substrate, the trench outlining a MEMS platform, and filling the trench with sacrificial trench material, fabricating the MEMS structure on the MEMS platform grinding the second side of the substrate to expose the sacrificial trench material; and removing the sacrificial trench material.

BRIEF DESCRIPTION OF THE DRAWINGS

The foregoing features of embodiments will be more readily understood by reference to the following detailed description, taken with reference to the accompanying drawings, in which.

DETAILED DESCRIPTION OF SPECIFIC EMBODIMENTS

Various embodiments provide solutions to minimize the effect of package stresses into the MEMS sensors packaged in overmold (e.g., plastic) packages. Any of a variety of stress-relief structures may be included in a wafer or silicon-on-insulator substrates to block or divert compressive or tensile stresses within the substrate, with the result that distortion of MEMS structures is reduced and the accuracy of the MEMS structures is increased in comparison to prior art MEMS device. A variety of such MEMS devices are detailed below.

To mitigate such distortions, various embodiments include a stress-relief gap which serves to intercept, block or divert stresses within the substrate of the MEMS device.

Definitions

As used in this description and the accompanying claims, the following terms shall have the meanings indicated, unless the context otherwise requires:

A "void" is a three-dimensional space substantially free of solid material. A "void" may be spanned by a bridge or other structure, provided that the bridge or other structure does not provide a linear path by which a mechanical stress could cross the void.

A "stress-relief gap" is a space or void between two parts of a device.

A "bridge-free stress-relief gap" is a space or void between two parts of a device, but which does not contain or include a bridge as described below.

A "MEMS device" is device having a first member, and a second member that is moveable with respect to the first member, for example in reaction to an external force or external stimulus. The second member may be referred to as a "MEMS structure." One examples of a MEMS device is an micromachined accelerometer as known in the art, having a support structure and a beam movably suspended from the support structure by one or more flexures, such that beam is configured to move relative to the support structure in response to an acceleration applied to the support structure. Another example of a MEMS device is a micromachined gyroscope as known in the art, having a support structure and a beam movably suspended from the support structure by one or more flexures, and one or more beam drivers configured to apply electrostatic force to the beam so as to cause the beam to oscillate in a first direction relative to the support structure, such that beam is configured to move in a second direction due to Coriolis forces in response to a rotation applied to the support structure.

An "integrated circuit" is a circuit that includes active semiconductor devices, such as transistors for example.

Figure 1A:
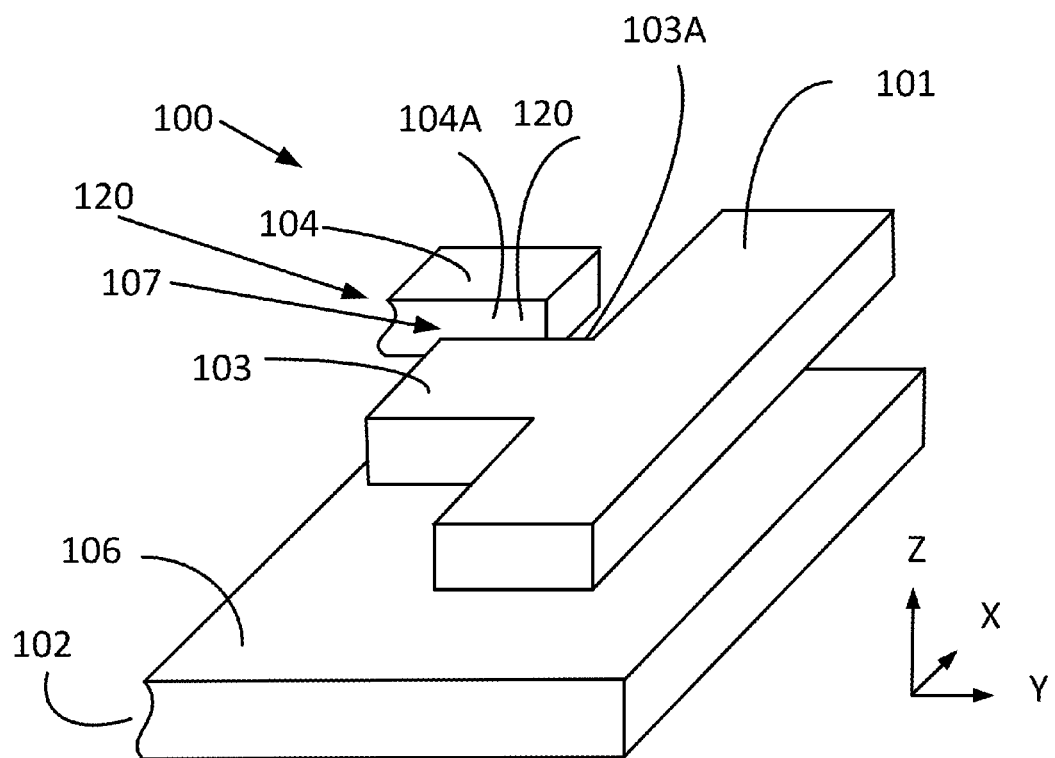
FIGS. 1A and 1B schematically illustrate a MEMS accelerometer according to one embodiment.
Figure 1B:
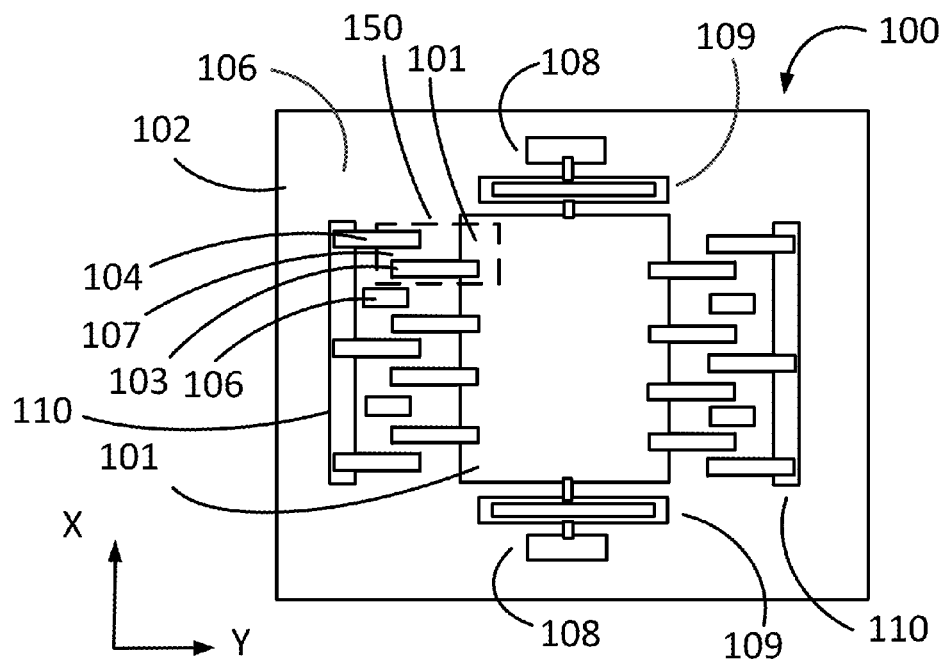

Some MEMS devices include structures suspended above a substrate. For example, FIGS. 1A and 1B schematically illustrate a portion of a micromachined accelerometer 100, in which a proof mass (or "beam") 101 is suspended by flexures 109 and anchors 108 above a substrate 102. The anchors 108 are fixedly coupled to the substrate 102. Flexures 109 are flexible and allow the beam 101 to move relative to the substrate 102 in response to an acceleration applied to the substrate 102. The flexures 109 and anchors 108 may be known as "beam support structures." FIG. 1B schematically illustrates a plan view of the accelerometer 100, while FIG. 1A schematically illustrates a perspective view of a portion 150 of accelerometer 100.

When the accelerometer 100 is not subject to an acceleration, the beam 101 remains suspended above the substrate 102 in a position that may be known as its "nominal" position, and does not move relative to the substrate 102. However, when the substrate 102 is subjected to acceleration, for example in the +X direction, the inertia of the beam 101 causes a displacement of the beam 101 relative to the substrate 102. Under acceleration, flexures 109 change their shape and length to allow the beam 101 to move relative to the anchors 108.

A finger 103, on the beam 101 forms a variable capacitor across gap 107 with a counterpart finger 104, and a separate variable capacitor with fixed finger 106. Finger 106 is coupled to the substrate 102, and finger 104 is suspended from finger anchor 110, which is coupled to the substrate 102. The capacitance of each variable capacitor varies when the beam 101 moves relative to the substrate 102. The variable capacitance can be electronically processed to produce an electrical signal representing the displacement of the beam 101, which in the case of accelerometer 100 correlates to the applied acceleration.

The gap 107 is typically quite small. For example, in the accelerometer 100, the gap 107 may be on the order of one micron to a few microns. As such, any distortion in the proof mass 101 or substrate 102, for example due to thermal stress within substrate 102, may also cause a change in the gap 107. Such a change may appear as a DC offset in the displacement signal.

Figure 2A:
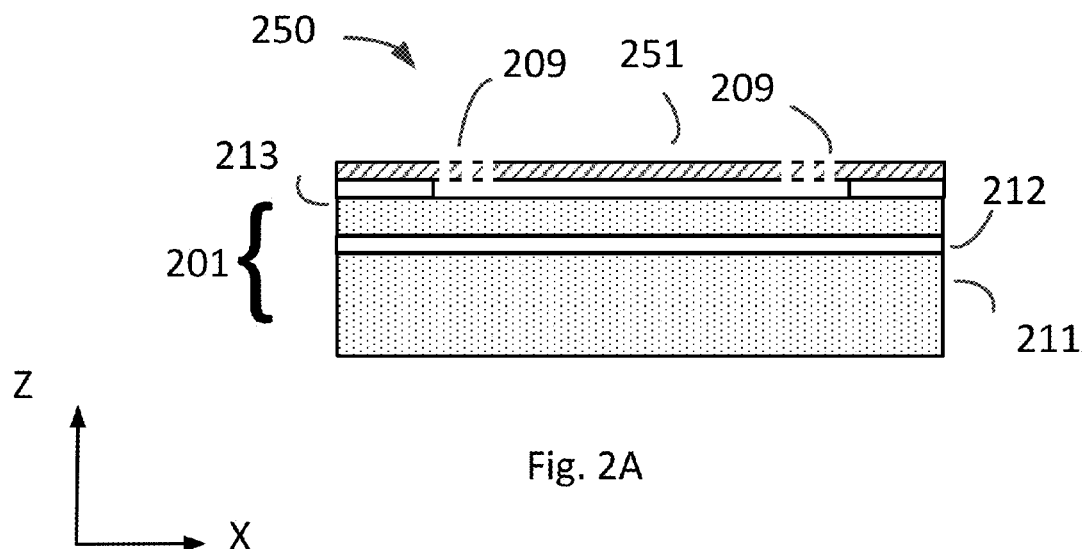
FIG. 2A-FIG. 2B schematically illustrate a Z-axis MEMS device according to one embodiment.

Some MEMS devices are fabricated on or from a Silicon-on-Insulator (or "SOI") wafer, such as the SOI wafer 201 in FIG. 2A. A typical SOI wafer 201 has a base layer, sometimes known as a "handle layer" 211. The handle layer 211 may be silicon, for example. The SOI wafer 201 also has a top layer, sometimes known as a "device" layer 213, coupled to one side of the handle layer 211 by an insulator layer 212. The device layer 213 may be doped or un-doped silicon, for example, and may be thinner than the handle layer 211. The insulator layer 212 may be an oxide (e.g., a "buried" oxide, or "box"), and is sandwiched (e.g., laminated) between the handle layer 211 and the device layer 213.

Figure 2B:
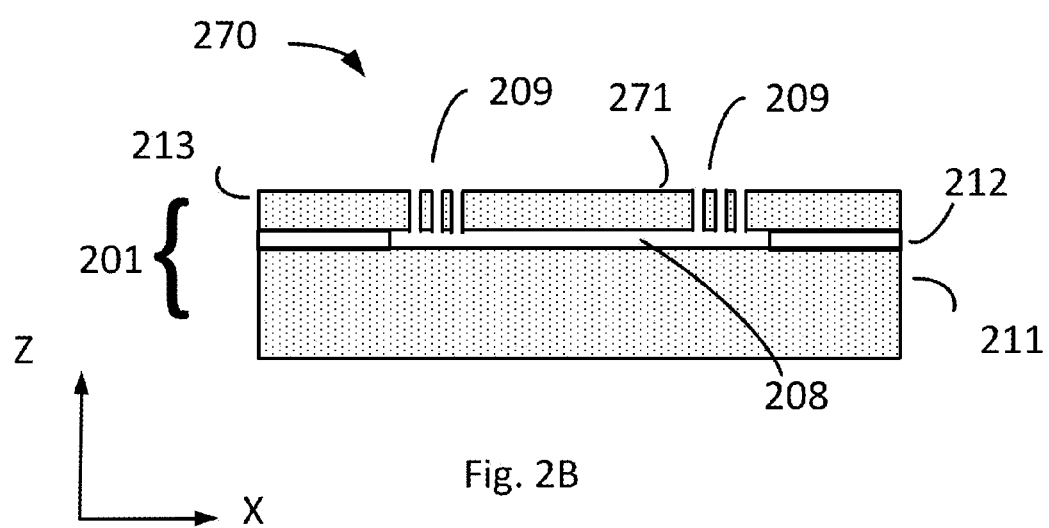

To further illustrate such devices, FIG. 2A and FIG. 2B schematically illustrate embodiments of MEMS devices 250, 270. It should be noted that various embodiments are sometimes described herein using words of orientation such as "top," "bottom," or "side." These and similar terms are merely employed for convenience and typically refer to the perspective of the drawings. For example, the substrate 201 is below the moveable mass 251 from the perspective of FIG. 2A. However, the substrate 201 may be in some other orientation relative to the moveable mass 251 depending on the orientation of the MEMS device 250. Thus, in the present discussion, perspective is based on the orientation of the drawings.

As with many MEMS devices, devices 250 and 270 each have a moveable mass suspended above a substrate. In some MEMS devices, the moveable mass 251 is formed from single crystal silicon (e.g., a part of the device layer 213), while in other MEMS devices the moveable mass 251 is formed from deposited polysilicon. For example, in the device 250 schematically illustrated in FIG. 2A, the moveable mass 251 is fabricated above the SOI substrate 201. As another example, the device 270 schematically illustrated in FIG. 2B includes a proof mass 271 in the device layer 213 of an SOI wafer 201.

In FIG. 2A, an accelerometer 250 has a substrate 201, one portion of which supports a moveable mass 251 suspended by flexures 209 so that the mass 251 is moveable relative to the substrate 201. The mass 251 and flexures 209 are separated from the substrate 201 by a gap 208, and together form a variable capacitor across gap 208.

In operation, the motion of the moveable mass 251 relative to the substrate 201 causes the flexures 209 to change shape, thus allowing variation in the gap 208 fingers on the moveable mass 251 (e.g., such as finger 103 in FIG. 1A, for example) and fingers fixedly attached to the substrate 201 (e.g., such as finger 104 in FIG. 1A, for example), to produce a changing capacitance.

In the embodiment shown in FIG. 2B, the substrate 201 includes the device layer 213, a bottom wafer 211 and a buried oxide layer (or "box layer") 212 of an SOI wafer. One or more terminal 221 may electrically couple features of the MEMS device, such as moveable mass 251 for example, to circuitry on the MEMS device, or external circuitry.

The capacitors on a MEMS device generally have gaps of very small dimensions between their fingers (or plates), and the capacitance of such capacitors is generally very sensitive to even small variations in the gaps between their fingers. Such sensitivity is, in large part, responsible for the ability of the sensor to sense motion of a moveable mass. Similarly, the motion characteristics of a flexure (e.g., 209) may also depend on small dimensions of its features. Consequently, if the gaps between the fingers (or plates) or dimensions of a flexure, a gap spanned by a flexure, change for reasons other than responding to the motions they are intended to detect or measure, such changes can adversely effect the sensitive and usefulness of the MEMS sensor. For example, if the substrate 201 in FIG. 2A or FIG. 2B extends its length along the X axis, the gap spanned by flexures 209 may also expand, causing the flexures 209 to expand, and become less flexible. In such a circumstance, the flexibility of the flexures may decrease, with the result that the motion of the moveable mass 251 may be damped, making the device less sensitive. Similarly, if such an expansion changes a gap between fingers of a variable capacitor, the sensitivity of that capacitor, or its ability to apply an electrostatic force to an opposing member, may be reduced, again rendering the device less sensitive. Also, such a gap between the fingers of a variable capacitor may cause an undesirable voltage offset between the fingers, also rendering the device less sensitive.

Figure 3A:
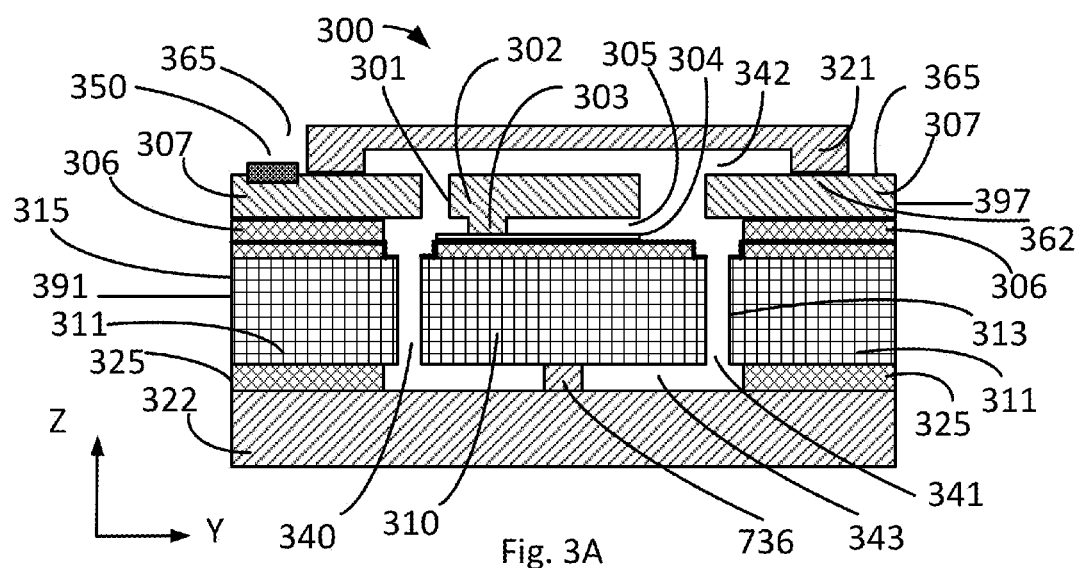
FIG. 3A-FIG. 3T schematically illustrate features of embodiments of MEMS devices.
Figure 3B:
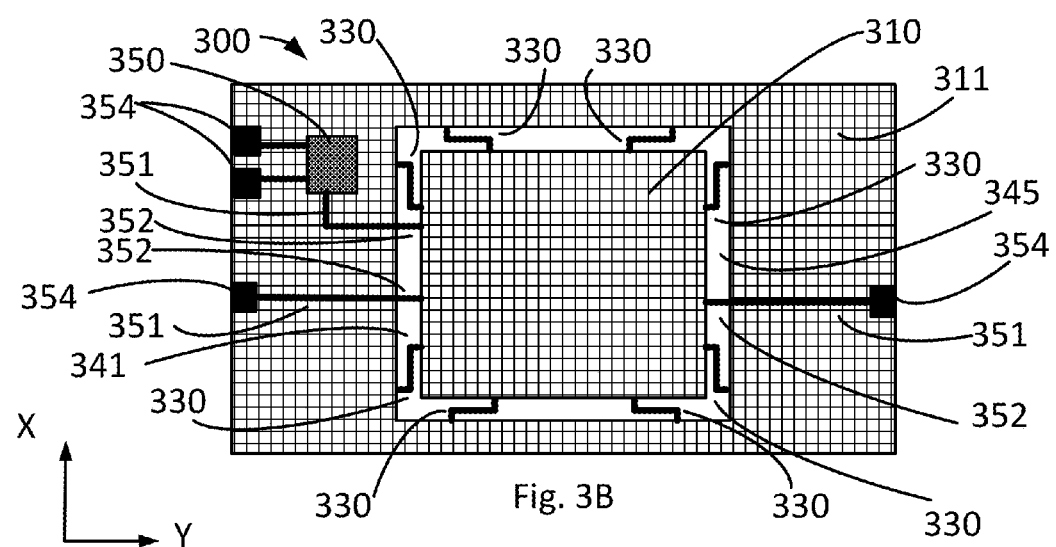

An embodiment of a capped MEMS sensor 300 having a substrate 311 with a stress-relief gap is schematically illustrated in FIG. 3A and FIG. 3B. In this illustrative embodiment, the substrate 311 defines a substrate plane 391, and includes a MEMS platform 310 supporting a MEMS device 301. In this embodiment, the MEMS device 301 is a cantilevered accelerometer having a cantilevered beam 302 suspended above an electrode 304 by a flexure base 303. However, in other embodiments, the MEMS device 301 could be any MEMS device, such as accelerometer 100, or a switch or a gyroscope, to name but a few examples.

When the sensor 300 is not under acceleration, the beam 302 and electrode 304 define a nominal gap 305 between them. In response to acceleration in the positive or negative Z-axis, however, the force of the acceleration causes a change in the gap 305 between the electrode 304 and the cantilevered beam 302. The magnitude of the acceleration may be determined by the amount of change in the gap 305, and the direction of the acceleration may be determined by whether the gap 305 widens (acceleration in the −Z direction) or narrows (acceleration in the +Z direction), both of which may be detected and measured in ways known in the art, for example by integrated circuits 350 on the sensor 300 or off the sensor 300 on a separate circuit chip. Stresses in the sensor, for example residual stresses from fabrication or encapsulation of a sensor, may negatively impact the accuracy of such measurements, however.

To mitigate the impact of stresses, the MEMS device 301 is disposed on a stress-isolated MEMS platform 310 suspended within and from substrate 311 by bridges 330. Alternately, or in addition, the MEMS platform may be suspended within the substrate 311 by one or more pillars 736. In this embodiment, the MEMS device 301 is formed as part of a MEMS device layer 307, and the MEMS layer 307 is coupled to the substrate 311 by one or more intermediate layers 306. The MEMS layer 307 defines a MEMS layer plane 397, parallel to the substrate layer plane 391.

A stress-relief gap 340, having a variable width 345, separates the MEMS platform 310 from the substrate 311 and from cap 321 and cap 322. The cap 322 may be coupled to the substrate 311 by adhesion layer 325. More particularly, as schematically illustrated in FIG. 3A and FIG. 3B, the stress-relief gap 340 includes lateral gap 341, top gap (or "void") 342, and bottom gap (or "void") 343. The lateral gap 341 may have a nominal width 345 of about 20 to 100 micrometers, for example, and the bottom gap 353 may have a width of about several microns. The cap 321 forms a cavity 342, which has a width sufficient to allow the moveable MEMS structure (e.g., beam 302 in the embodiment of FIG. 3A) to move, and may be determined according to ways known in the art.

As schematically illustrated in FIG. 3A and FIG. 3B, the stress-relief gap 340 completely surrounds the MEMS platform 310 in every direction (i.e., in the X-axis, in the Y-axis, and in the Z-axis). The stress-relief gap may be filled with a gas, such as air or nitrogen, for example, or may be a vacuum. The MEMS platform 310 may be thought of as an island surrounded by the stress-relief gap 340. The stress-relief gap 340 prevents physical stresses, e.g., from substrate 311, from reaching the MEMS platform 310 because such physical stresses cannot jump across the stress-relief gap 340.

The bridges 330 are flexible and configured to flex in response to stresses within, or propagating within, the substrate 311. For example, a physical stress propagating in the X axis in substrate 311 would, in the absence of lateral gap 341, propagate through to a portion of the substrate beneath the MEMS device 301 (i.e., to a point on the MEMS platform 310 in FIG. 3A and FIG. 3B). However, because the stress-relief gap 340 does not provide a physical path through which such stress may propagate, the stress is prevented from propagating from the substrate 311 to the MEMS platform 310, thus mitigating that amount of stress that reaches the MEMS device 301.

Several features of the bridges 330 are noteworthy. First, the bridges 330 are flexible so as to allow the stress-relief gap to expand and contract in response to stresses in the substrate 311, and yet sufficiently rigid to suspend the MEMS support structure 310 from the substrate 311. For example, if a stress in the substrate 311 would tend to propagate towards the MEMS platform 310, the lateral gap 341 responds by narrowing or widening. More particularly, the stress causes the face 313 of the substrate 311 to move towards (or away from) the MEMS platform 310, thus narrowing (or widening) the lateral gap 341. As the lateral gap 341 narrows, the bridges 330 change shape to absorb this motion, thus allowing the face 313 to move (e.g., expand) relative to the MEMS platform 310 without forcing or causing the MEMS platform 310 to move, or at least mitigating any such induced motion of MEMS platform 310.

Second, the bridges 330 are not so flexible as to substantially bend, change shape of otherwise respond in reaction to an acceleration applied to the substrate 311. In other words, while an accelerometer beam (e.g., beam 101) is suspended by flexures (e.g., flexures 109), and those flexures are pliable such that the flexures allow the accelerometer's beam to move fluidly in response to an applied acceleration, the bridges 330 are less flexible so as to rigidly suspend the MEMS platform 310 from the substrate 311. In other words, the MEMS platform 301 is suspended from the substrate 311 such that when the MEMS platform 310 moves in response to stresses, it does so in a way that is not detected by the MEMS device 301, and forces that cause a second member of a MEMS device 301 to move relative to a first member do not cause motion of the MEMS platform 310 relative to the substrate 311.

In general, the flexures in a MEMS device, and the jumpers and the bridges disclosed herein, may be characterized by their resonant frequency. For example, the flexures of an accelerometer (e.g., flexures 109 in FIG. 1) may be about 5 kHz, while the resonant frequency of a bridge 330 may be about 200 kHz or higher (i.e., a response ratio of 40:1). Depending on the application and the stress tolerance of the MEMS device, the response ratio may be more or less than 40:1, and may, for example, be 25:1; 30:1; 35:1; 45:1; 50:1; or 55:1, to name but a few examples. The ratio of the resonance frequency of a MEMS device flexure 109 to resonant frequency of a bridge 330 may be specified by the designer of the MEMS device, depending for example on the application for the MEMS device. The jumpers 352 are flexible and pliable. Because the bridges 330 suspend the MEMS platform 310, the resonant frequencies of the jumpers 352 have a negligible impact on the motion of the MEMS platform 310.

Figure 3C:
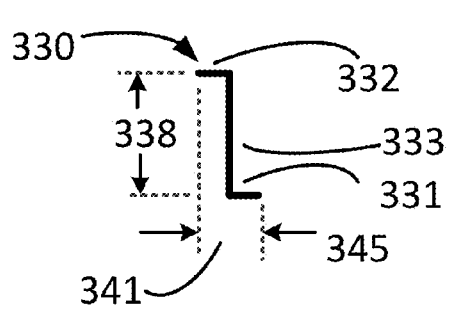
Figure 3D:
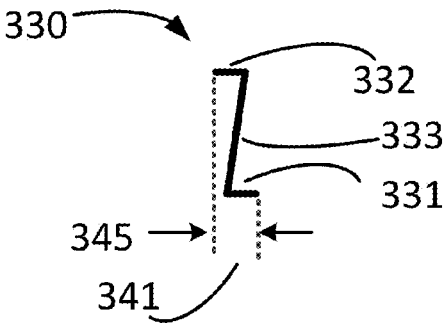

An embodiment of a bridge 330 is schematically illustrated in FIG. 3C and FIG. 3D. In FIG. 3C, an embodiment of a bridge 330 includes a first leg 331 and a second leg 332 that, together, have a length configured to span the stress-relief gap 340 (e.g., across lateral gap 341, for example). The first leg 331 and the second leg 332 are coupled by a crossbeam 333. The crossbeam 333 in this embodiment is approximately 20 micrometers wide and 300 micrometers in length.

In the embodiment of FIG. 3C, the crossbeam 333 meets the first leg 331 and the second leg 331 at right angles, respectively, although in other embodiments the angles may be other than right angles. Under stress, such as when the lateral gap 341 is narrowed (i.e., the gap 345 is reduced relative to the gap 345 in FIG. 3C), the bridge 330 changes shape to absorb the change in the lateral gap 341, for example as schematically illustrated in FIG. 3D. In the embodiment of FIG. 3D, the angles between the crossbeam 333 and the legs 331 and 332, respectively, has change and is less than 90 degrees. As such, the bridge 330 of FIG. 3C and FIG. 3D may be referred to as a "Z" bridge. Consequently, physical stress from the substrate does cross the stress-relief gap 340. However, the crossbeam 333 is very stiff along its length, and is substantially incompressible. The stiffness of the crossbeam 333 helps resist motion of the MEMS platform 310 in the direction of the length of the crossbeam 333, and therefore resists compression or narrowing of a the lateral gap 341 in the direction of the length of the crossbeam 333.

Figure 3E:
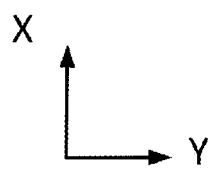
Figure 3E:
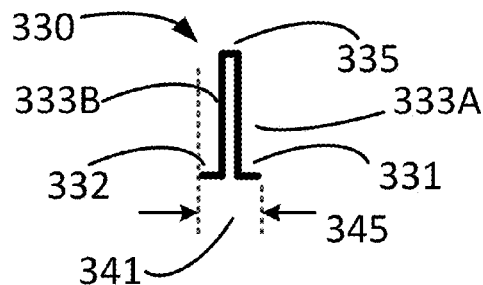

An alternate embodiment of a bridge 330 is schematically illustrated in FIG. 3E, and may be known as a "U-shaped" bridge or a "top-hat" bridge. The U-shaped bridge 330 includes two legs 331 and 332, which may define a line between the substrate 311 and the MEMS platform 310. The U-shaped bridge 330 also includes a first crossbeam 333A coupled to leg 331 and a second crossbeam 333B coupled to leg 332, and a crossbeam connector 335 coupled between the first crossbeam 333A and second crossbeam 333B distal from the legs 331 and 332.

Figure 3F:
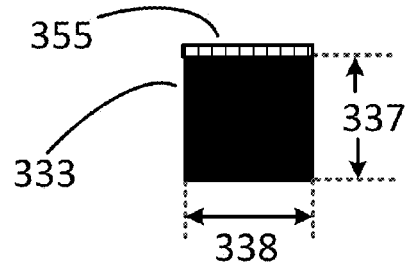
Figure 3G:
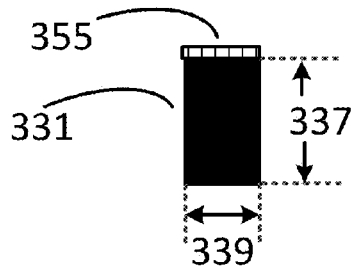

Generally, the bridges 330, and the legs 331, 332 and crossbeams 333, 333A and 333B are fabricated from the material of the substrate 311 and are therefore in the substrate layer plane, and have a thickness 337 that is the same as the thickness 315 of the substrate, although that is not a limitation of various embodiments, and the thickness 337 could be greater or less than the thickness 315 of the substrate. Each crossbeam 333 (also 333A and 333B) also has a length 338 (as schematically illustrated in FIG. 3F, (although only crossbeam 333 is schematically illustrated in FIG. 3F) that is, generally, longer than the length 338 of legs 331 and 332 as schematically illustrated in FIG. 3G (although only leg 331 is schematically illustrated in FIG. 3G). In some embodiments, the length 339 of a crossbeam is 2 or more times the length of the leg 331 or leg 332, and in some embodiments the length of the crossbeam may by 3, 4, 5, 6, or 10 times or more the length of the leg 331 or leg 332. Generally, the longer the length 338 of the crossbeam, the greater the flexibility of the bridge 330.

Figure 3H:
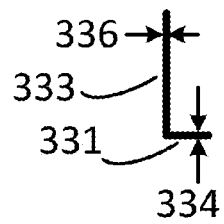

The width 336 of crossbeams 333, 33A, 333B and the width 334 legs 331, 332, as schematically illustrated in FIG. 3H for example, may be 20 micrometers, for example.

In some embodiments, a bridge 330 may include an electrical conductor (such as electrical conductor 355 as schematically illustrated in FIGS. 3F and 3G, for example) coupled to the MEMS device 301 and configured to conduct electrical signals across the stress-relief gap 340. As such, the conductor 355 provides and electrical connection as part of the substrate layer 311.

Figure 3I:
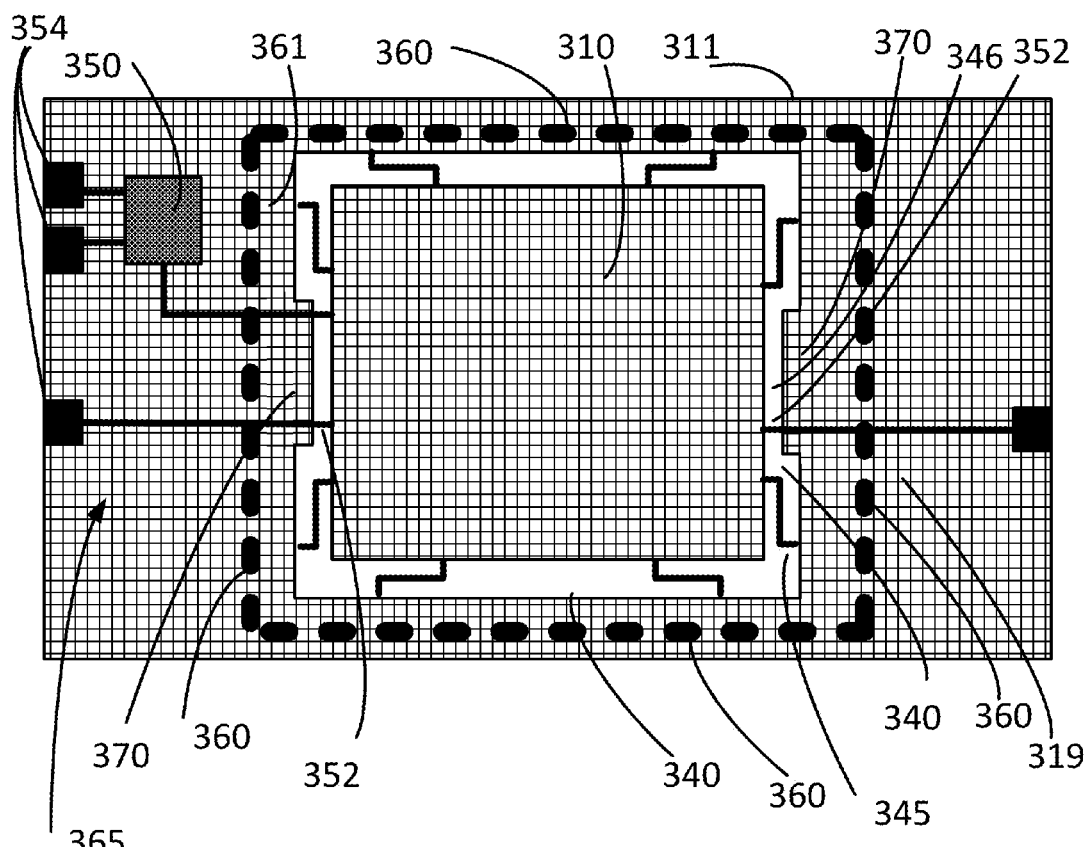

FIG. 3I schematically illustrates a substrate 311 and identifies a peripheral region 360 on the surface 319 of the substrate 311. The peripheral region 360 circumscribes the MEMS platform 310 and the stress-relief gap 340, and defines an area on the surface 319 of the substrate 311 suited for bonding of a cap, as described below, because, for example, the surface 319 within the peripheral region 360 if free of obstructions and gaps 340, so that cap bonded to the surface 319 within the peripheral region 360 may make a robust and preferably hermetic seal with the substrate 311. If the substrate 311 includes integrated circuitry 350, that integrated circuitry 350 may be disposed within the inner periphery 361 of the peripheral area 360, or disposed external to the inner periphery 361 of the peripheral area 360 as schematically illustrated in FIG. 3I for example. The surface 319 of the substrate 311 external to the peripheral area may be referred to as a shoulder 365, and may provide a space for bond pads 354 and/or circuits 350, for example. In an alternate embodiment, the MEMS device layer 307 may include such a peripheral region 362, and a cap may be coupled to the peripheral region 362 on the MEMS device layer 307, for example as schematically illustrated in FIG. 3A.

FIG. 3I also schematically illustrates an optional jumper peninsula 370 extending into the stress-relief gap 340 from the substrate 311, thereby decreasing the width 346 of the gap 340. This narrower portion of the gap 340 provides a span for jumpers 352 that is shorter than the nominal width 345, thus reducing the length of the jumpers 352. A shorter length 359 for jumpers 352 results in less physical stress on the jumpers 352 as the stress-relief gap 340 changes.

Figures 3J, 3K:
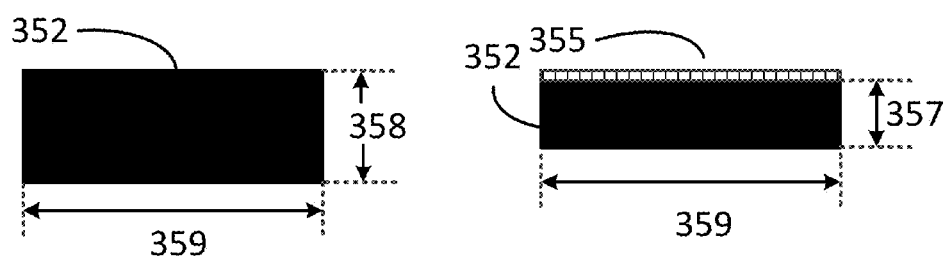
Figure 3L:
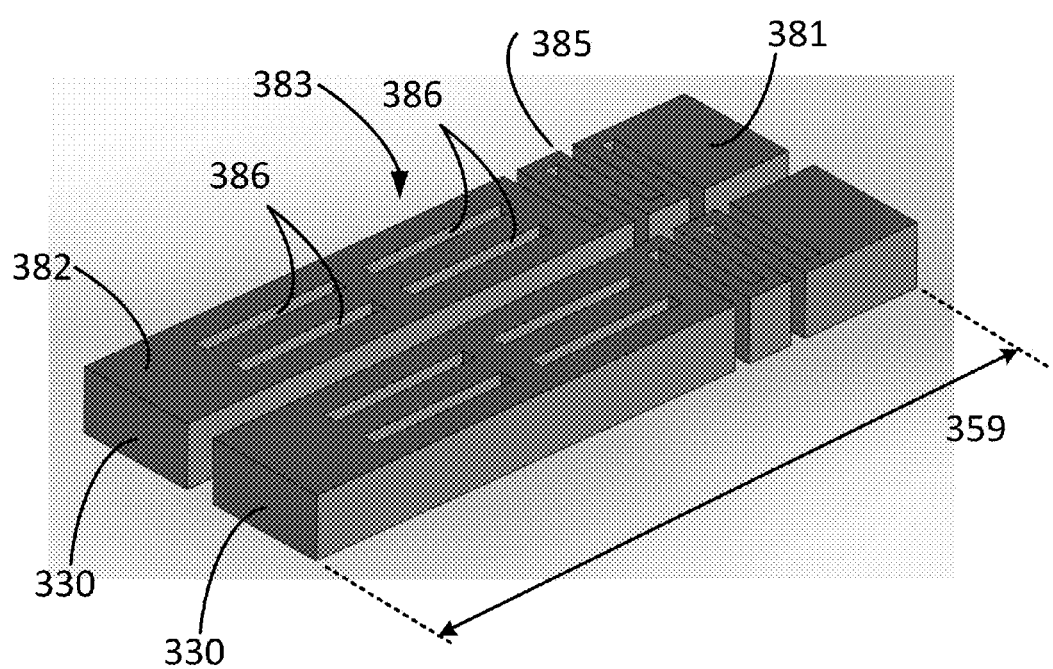

An alternate embodiment of a jumper 352 is schematically illustrated in FIG. 3L, in which two such jumpers are shown. Each jumper 352 has two end regions 381 and 382 at opposite ends, and a mid-section 383 between the end regions 381 and 382. The mid-section 383 optionally includes one or more jumper apertures 386 that pass all the way through the jumper 352, to provide a passage by which etchant can flow through the jumper 352 for purpose of etching a substrate or other material at the opposite side of the jumper 352. In the embodiment of FIG. 3L, the jumper 352 includes a flexure 385, disposed between the end region 381 and the mid-section 383. The flexure 385 allows the jumper 352 to change its length 359 in response, for example, to stress-induced displacement of a MEMS platform 310. In the embodiment of FIG. 3L, the flexure 385 has a serpentine shape, but in other embodiment may have a variety of other shapes, such as the shape of closed box flexure 109 in FIG. 1B for example.

Figure 4:
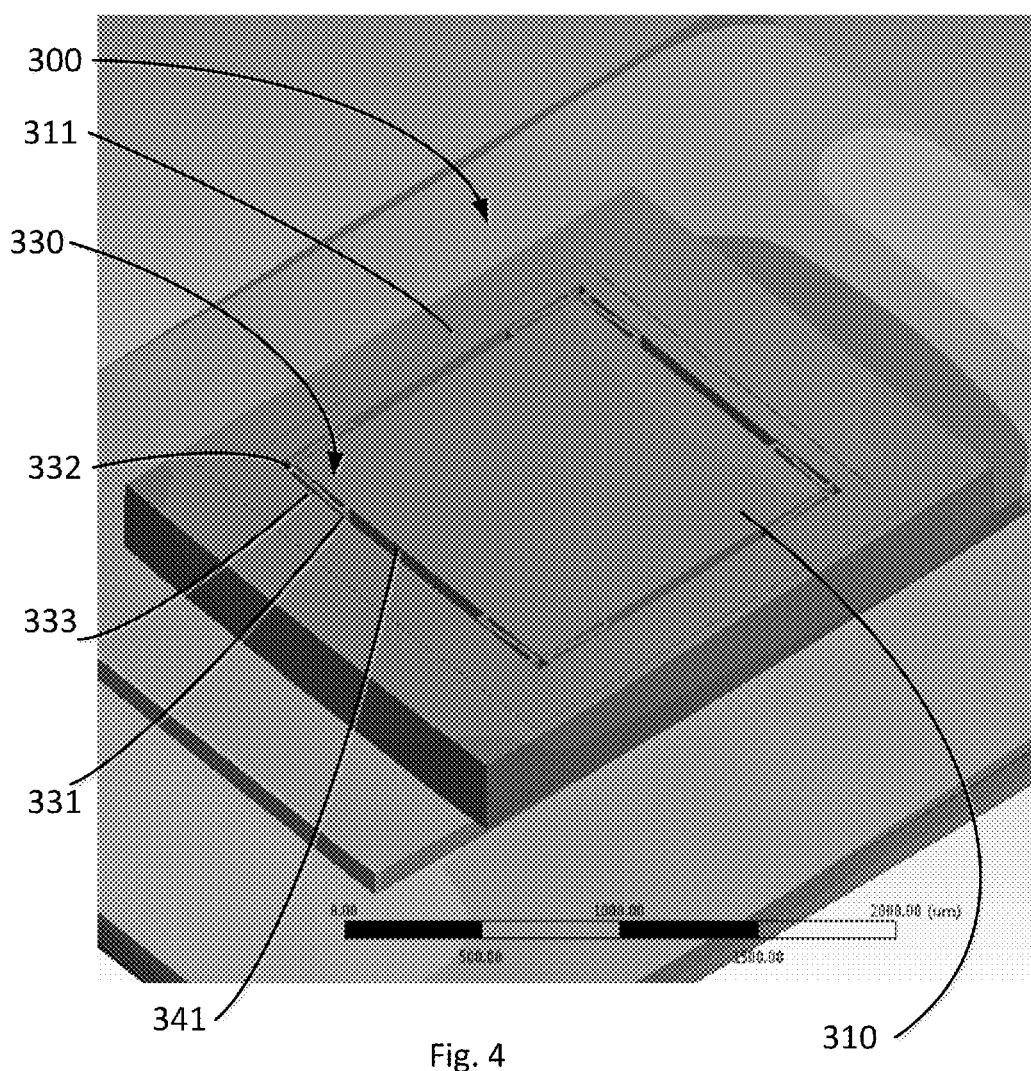
FIG. 4 schematically illustrates a MEMS platform according to one embodiment.

FIG. 4 schematically illustrates a MEMS platform 310 coupled to a substrate 311 by a eight bridges 330. As shown in FIG. 4, the crossbeam 333 meets the legs 331, 332 at an angle of less than 90 degrees, for example because the device 300 is under physical stress, or because the bridges are fabricated to have such an angle even in the absence of such stress (e.g., in their nominal positions).

Some embodiments also include electrically-conductive gap-spanning jumpers 352 that span the stress-relief gap to provide power, ground and signal connections to the MEMS device 301 on the MEMS platform 310. For example, as schematically illustrated in FIG. 3B, the sensor 300 includes one or more jumpers 352 that electrically couple to conductor or bus 351, which is electrically coupled to integrated circuit 350. FIG. 3J and FIG. 3K schematically illustrate an embodiment of a jumper 352 having a length 359 and a width 358, and a thickness 357. In some embodiments, the jumper 352 is conductive, and in some embodiments the jumper 352 includes a conductive layer 355. Generally, the thickness 357 of a jumper 352 is substantially less than the thickness 337 of a bridge 330 and substrate 311. The length 359 of the jumper 352 is sufficient to span the stress-relief gap 340 at the point where the jumper 352 crosses the gap 340. In an illustrative embodiment, a jumper 352 has a length 359 of 100 microns, a width 358 of 16 microns, and a thickness 357 of 8 microns.

In some embodiments, bridges 330 couple between the MEMS platform 310 and the inside corner 380 of the surrounding substrate 311, as schematically illustrated in FIG. 3M, FIG. 3N, FIG. 3O and FIG. 3P, for example. FIG. 3M schematically illustrates two bridges 330, each having a shape as schematically illustrated in FIG. 3C. Each bridge couples to the surrounding substrate 311 at or near the inside corner 380, and couples to the MEMS platform 310 at a point distal from the corner 380. The embodiment of FIG. 3O schematically illustrates two bridges 330 as in FIG. 3M, and includes an "L" shaped stress-relief notch 3303 inside of the corner formed by the two bridges 330.

FIG. 3N schematically illustrate two bridges 330, each having an "L" shape, in which one end couples to the surrounding substrate 311 at or near the inside corner 380, and the other end couples to the MEMS platform 310 at a point distal from the corner 380.

FIG. 3P schematically illustrates a single curved, or "hook shaped" bridge 330, having a straight end 3301 coupled to the MEMS platform 310, and a curved end 3302 coupled the surrounding substrate 311.

Figure 3Q:
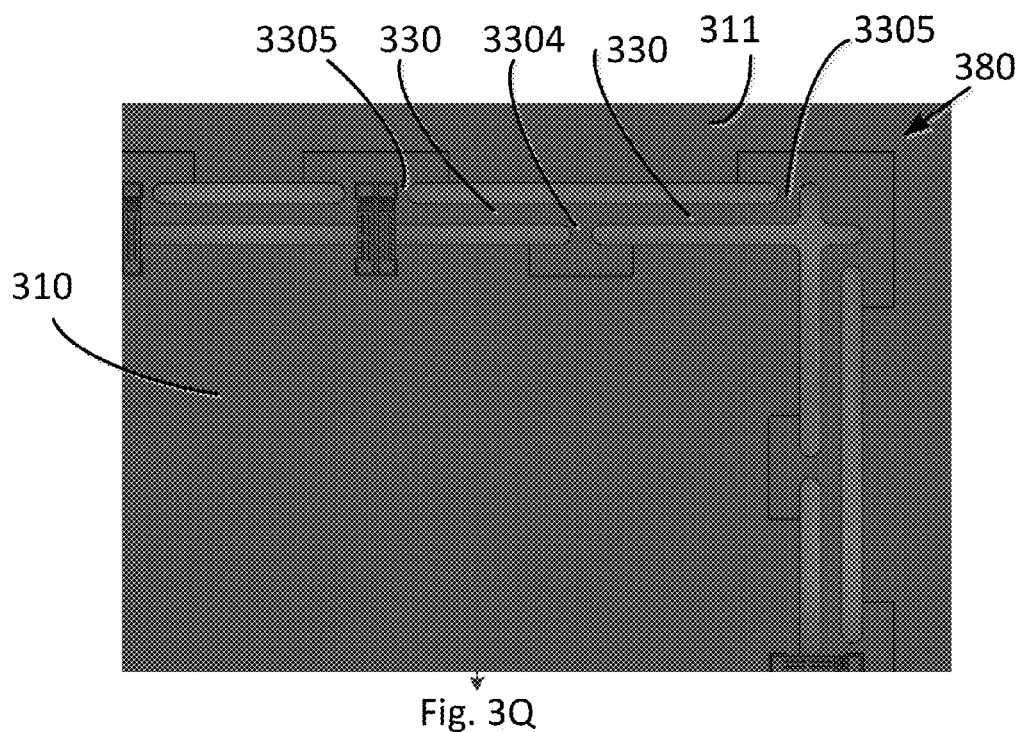

Some embodiments include one or more "U"-shaped bridges, wherein the open-end of the "U" is coupled to the surrounding substrate 311, and the closed-end of the "U" 3304 is coupled to the MEMS platform 310, and schematically illustrated in FIG. 3Q for example. In the embodiment of FIG. 3Q, one of the open-ends 3305 of the "U"-shaped bridge is coupled to the surrounding substrate 311 at or near the corner 380.

Figure 3R:
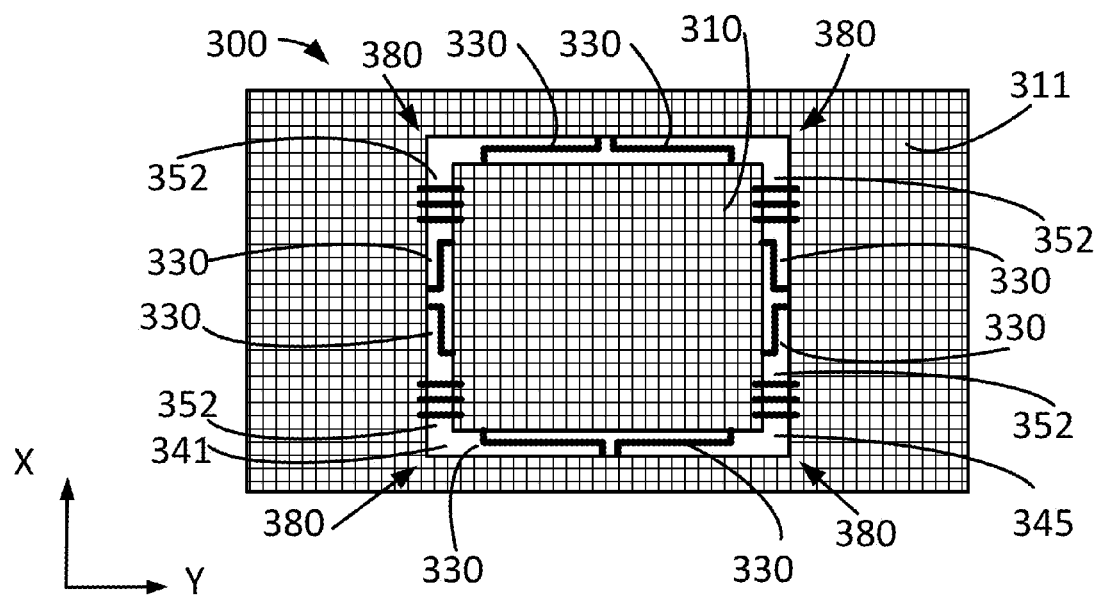

In some embodiments, bridges 330 couple nearer the center of MEMS platform 310, and have one or more jumpers 352 coupled between the MEMS platform 310 and the surrounding substrate 311 and disposed between the bridges 330 and the corners 380, as schematically illustrated in FIG. 3R, for example. In FIG. 3R, one end of the each bridge 330 is coupled to the surrounding substrate 311 at or near a point that is across from the center point of an opposing edge of the MEMS platform 310, while distal end of each bridge 330 couples to the MEMS platform 310 at points distal from such center point. In this configuration, the ends of the each bridge 330 that couples to the substrate 380 are very close to each other therefore the strain transferred from substrate 380 to the bridges are minimal. One or more jumpers 352 span the gap between the MEMS platform 310 and the surrounding substrate 311 at points between the bridges 310 and the inside corner 380. In some embodiments, the bridges are disposed symmetrically about X and Y axis to mitigate stress mismatch.

Figure 3S:
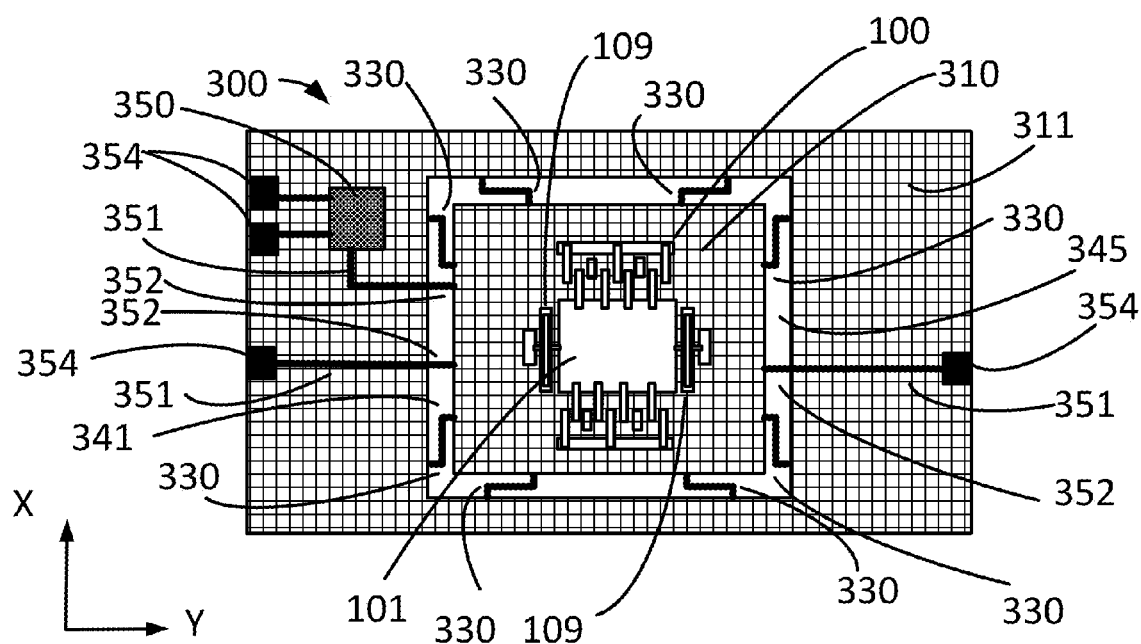
Figure 3T:
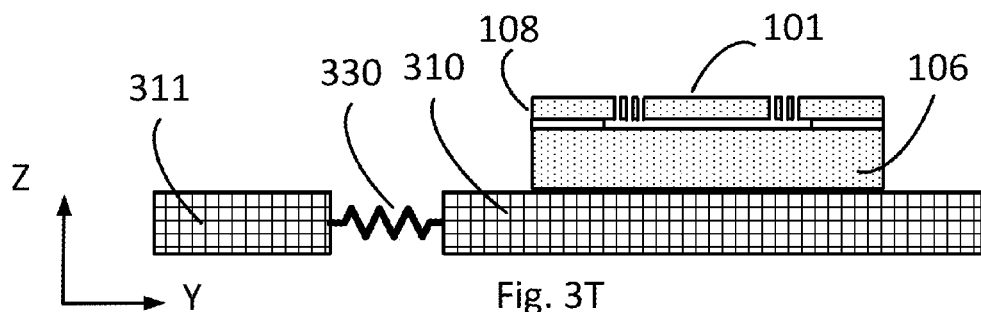

An alternate embodiment of a MEMS device is schematically illustrated in FIG. 3S and FIG. 3T, and includes an accelerometer 100 on the MEMS platform 310. As shown in FIG. 3S, and FIG. 3T, in order for a physical stress from substrate 311 to reach beam 101, the stress would have to cross bridge 330 and flexure 109. As such, the bridge 330 and the flexure 109 may be described as being arranged or disposed in series with one another. In some embodiments, such as in FIGS. 3S, and 3T, the bridge 330 and flexure 109 are not in the same plane (i.e., bridge 330 is in a different X-Y plane than flexure 109), so the bridge 330 and flexure 109 are not along a linear path, and any stress traveling from the substrate 311 to the beam 101 could not do so by traveling in a straight line from substrate 311 to beam 101. In this configuration, as in the other embodiments described herein, the stress would induce a physical distortion in, and thus be absorbed by, the bridge 330, so little if any of the physical stress would reach flexure 109.

Some embodiments also include one or more conductors or busses 351 that electrically coupled the integrated circuit 350 to bond pads 354. Alternately, or in addition, some embodiments include one or more jumpers 352 and conductors 351 that electrically couple to one or more bond pads 354. The jumpers 352 are short and are as flexible as, or more flexible than, the bridges 330, so as not to impede the relative motion of the substrate 311 and MEMS platform 310.

Figure 5:
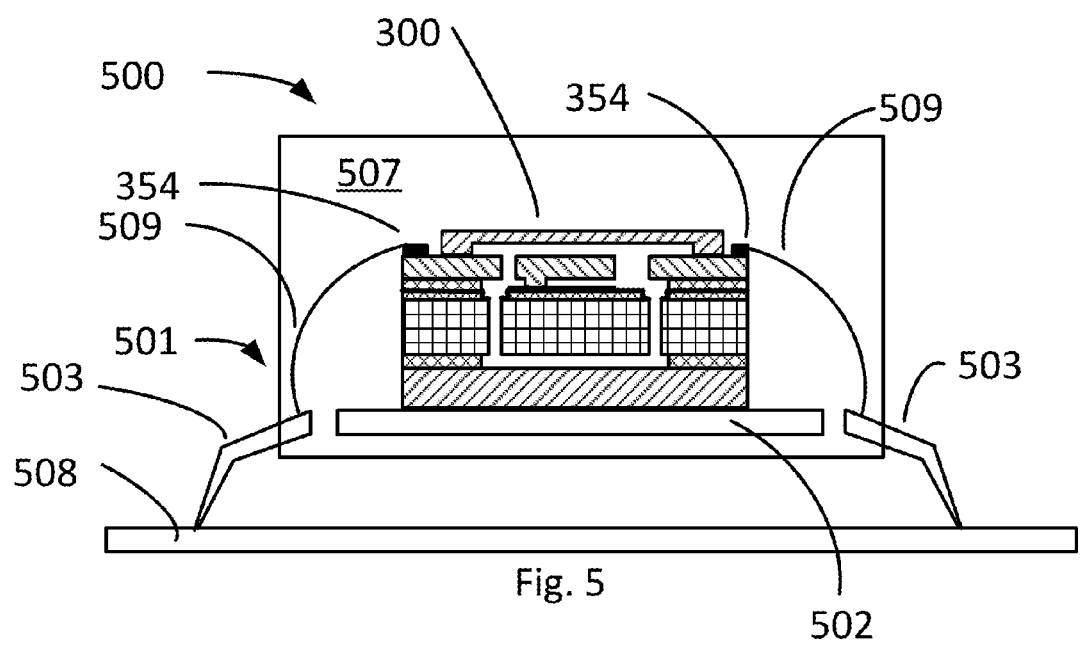
FIG. 5 schematically illustrates an encapsulated MEMS product according to one embodiment.

FIG. 5 schematically illustrates an encapsulated MEMS sensor 500. For illustrative purposes, sensor 500 includes a capped MEMS device schematically illustrated as device 300, but alternate embodiments could include any of a variety of MEMS devices, such as any of the embodiments described herein.

The encapsulated sensor 500 includes a lead frame 501 having a paddle 502 and leads 503. Each of the leads 503 is electrically isolated from the paddle 502.

The MEMS device 300 is physically coupled to the paddle portion 502 of the lead frame 501, and is electrically coupled to the leads 503 by one or more wirebonds 509. The integrated device 300, paddle 502, one or more wirebonds 509, and a portion of each lead 503 are encapsulated in encapsulant 507. The packaged sensor 300 may be mounted to a substrate 508 by leads 503 extending to the outside of the encapsulant 507.

The material properties of the encapsulant (i.e., mold compound for example, as known in the art) such as Young's modulus and coefficient of thermal expansion (CTE) vary largely with the temperature. The Young's modulus of the mold compound changes more than 2 orders of magnitude over the temperature of −50 C to 150 C. Specifically, it changes from being a stiff material (E=24 GPa) in low temperatures (−50 C to 25 C) to a soft material (E=0.8 GPa) above 100 C. Also, its CTE changes more than three times over this temperature range (from 12e-6/C to 38e-6/C) and it is greatly higher than the CTE of Silicon (2e-6/C). As a result, large thermal stresses are generated and transferred to the MEMS sensor 300. This creates large sensitivity drift in the MEMS sensor over the temperature range of 175 C to −40 C. This issue is more pronounced in the MEMS sensors based on the capacitive transductions and it is desirable to address this issue for the sensors having capacitive gaps of less than or equal to 1 micrometer.

Figure 6A:
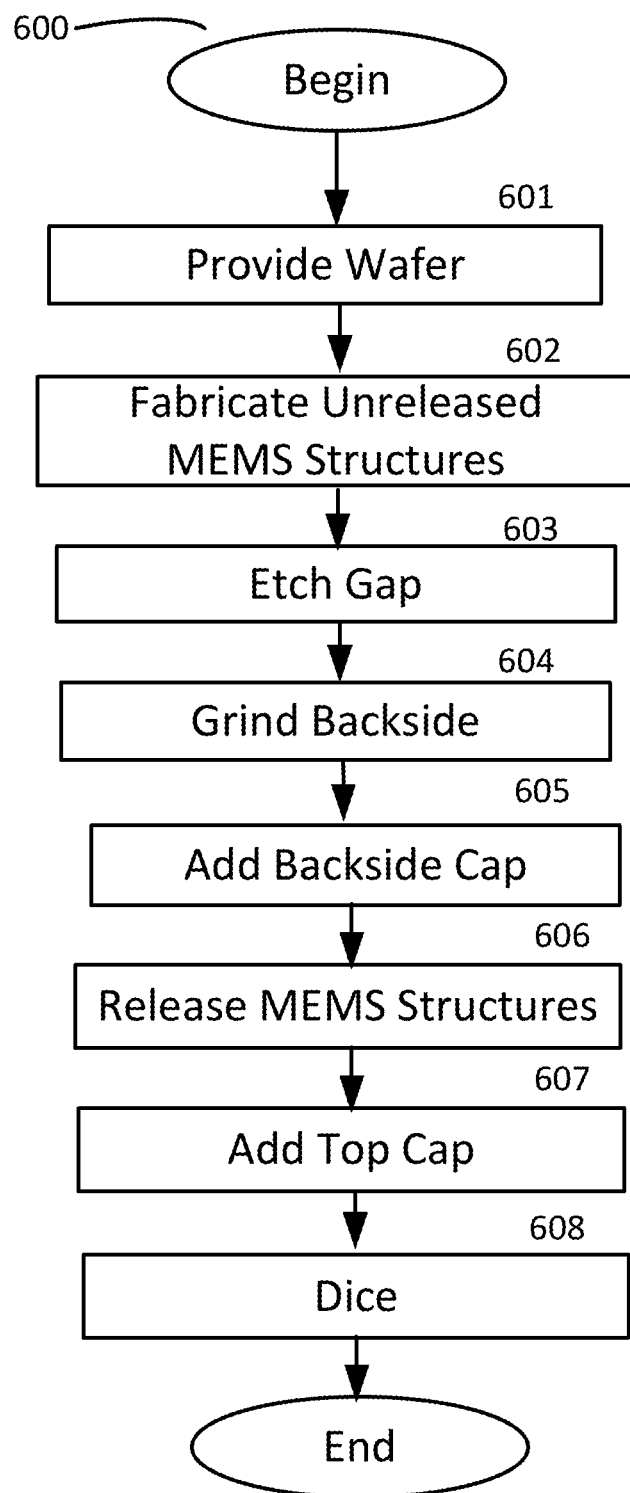
FIG. 6A is a flow chart of an embodiment of a method of fabricating a MEMS product.

An embodiment of a method 600 of fabricating a chip or wafer with a stress-relief trench is illustrated in FIG. 6A, and partial views of a device 799 at various stages of fabrication are schematically illustrated in FIGS. 7A-7F. The views in FIGS. 7A-7F show only one end of a MEMS device 799. Although method 600 and FIGS. 7A-7F schematically illustrate fabrication of MEMS device 799 on a silicon wafer 700, a person of ordinary skill in the art would be able to adapt the steps of method 600 to the fabrication of a MEMS device using an SOI wafer, for example by fabricating a MEMS island (e.g., MEMS island 740) as with the wafer 700 below.

Figure 7A:
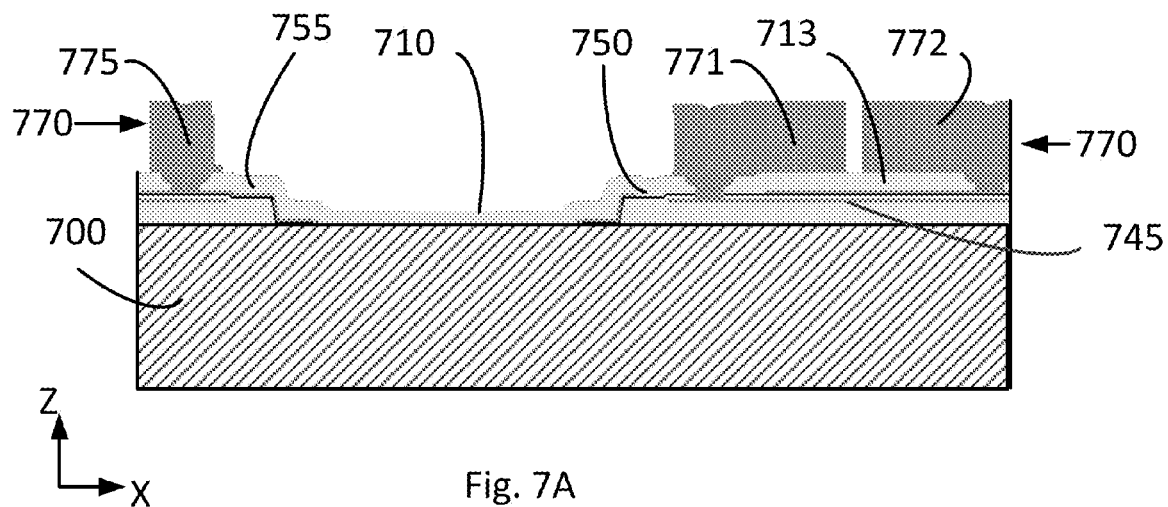
FIGS. 7A-7H schematically illustrate features of a MEMS device at various stages of fabrication according to the method of FIG. 6A.

The method 600 begins at step 601 with the provision of a wafer 700, which may be similar to wafer 311, and may be a silicon wafer as known in the art, for example. The wafer may have a thickness 707 of 780 microns, for example. In FIG. 7A, only a portion of the wafer 700 is shown. More specifically, the portion schematically illustrated in FIG. 7A is only a part of a MEMS device, and the wafer 700 includes many other identical MEMS devices.

Next, at step 602, the method forms an unreleased MEMS structures. As known in the art, a MEMS device includes at least one member (e.g., a beam or proof mass) that is movable with respect to another feature (e.g., a substrate or a fixed finger). In fabricating MEMS devices, however, it is known to fabricate the moveable member that is, at an intermediate stage of fabrication, not yet movable with respect to the substrate. Such a MEMS structure may be described as "immobile" or "immobilized."

For example, in FIG. 7A, after forming other features, such as polysilicon layer 745, and inter-poly nitride 750, step 602 includes depositing a layer 710 of oxide, and patterning the oxide layer 710, by methods known in the art, to form oxide region 713. The method then deposits polysilicon beam layer 770, from which MEMS structures 771 and 772, are fabricated. MEMS structures 771 and 772 are in physical and electrical contact with polysilicon layer 745 and inter-poly nitride layer 750, respectively, to provide electrical communication between the MEMS structures 771 and 772 and terminals or circuits. At this point in the process, the MEMS structures 771 and 772 are not movable with respect to the wafer 770 because they are secured by oxide region 713. In this way, additional processing may be performed while the MEMS structures 771 and 772 are immobilized.

Figure 7B:
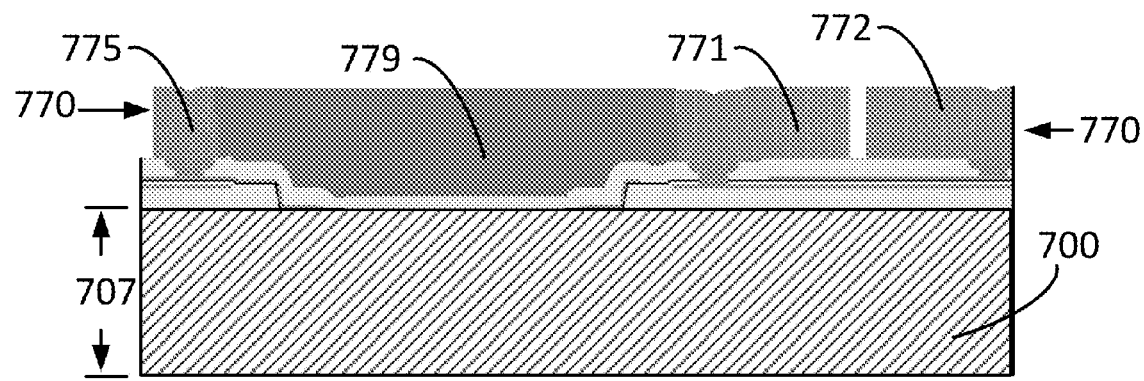

Step 602 also includes patterning the beam layer 770 to leave a polysilicon span 779, to form a jumper that spans a gap, such as jumper 352 in FIG. 3B for example. Such a span 779 is schematically illustrated in FIG. 7B, for example.

Figure 7C:
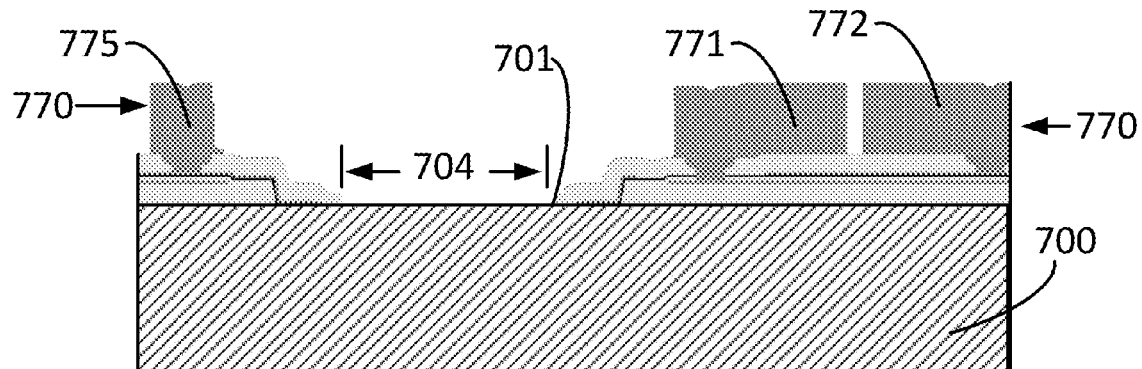
Figure 7D:
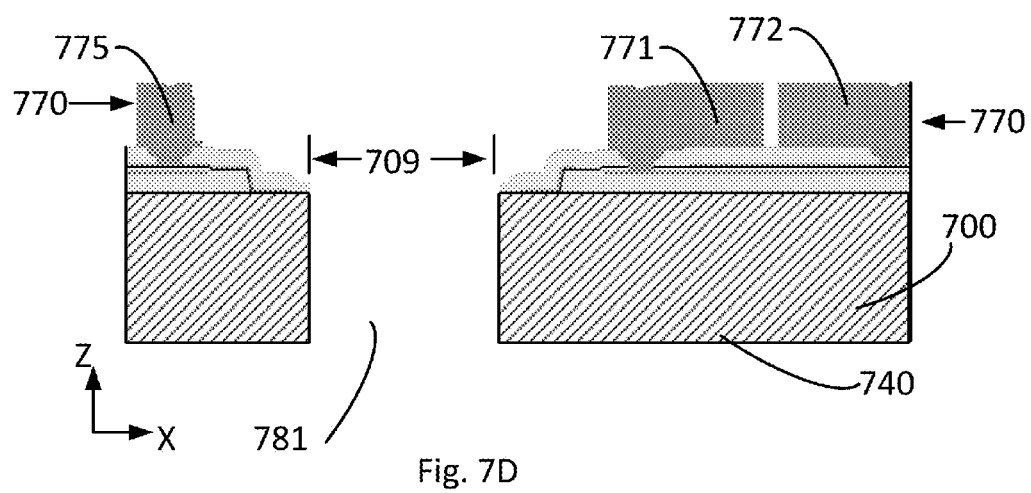

The method 600 next forms the gap 781, at step 603, as schematically illustrated in FIG. 7C and FIG. 7D. To etch the gap 781, the layer of oxide 710, which is approximately 2 microns thick, is patterned to provide an opening 719 in the desired location of the gap 781. The opening 719 in the oxide 710 may have a width 704 of about 20 microns, for example. Then the gap 781 may be etched by, for example, deep reactive-ion etching ("DRIE") through the opening 719. The gap 781 will have a width 709 approximately equal to the width 704 of the opening 719.

The gap 781 defines the island 740 (which will ultimately be a MEMS platform, e.g., platform 310). The process of forming the gap 781 does not, however, remove all of the substrate within the area of the gap 781. Rather, portions of the substrate material are left in place to form bridges, such as bridges 330 in FIG. 3B, for example.

Optionally, at step 604, the wafer 700 is flipped and the backside 703 of the wafer 700 is ground. The grinding at step 605 reduces the thickness 707 of the wafer 700.

Figure 7E:
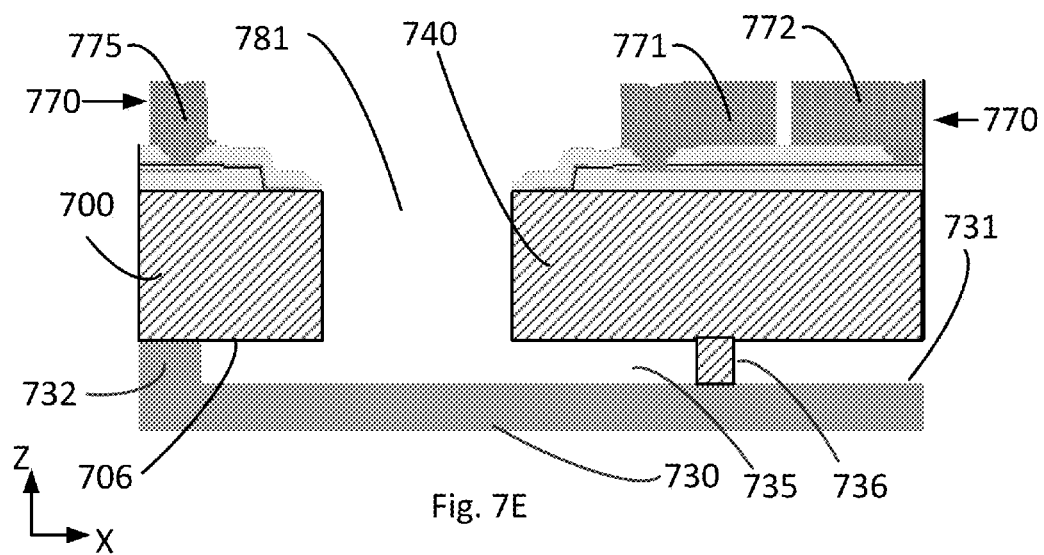

Next, step 605 bonds a backside cap 730 to back surface 706 of the wafer 700, as schematically illustrated in FIG. 7E. The cap 730 may be silicon, and may be bonded to the wafer 730 by a silicon-silicon fusion bond, or by a metal-metal bond, such as an Au—Au bond or a GE-AL bond, as known in the art.

The backside cap 730 may be hermetically sealed to the back surface 706 around the periphery 732 of the backside cap 730. The periphery 732 of the backside cap 730 circumscribes the island 740, so that the island 740 will be physically isolated from physical stress from the periphery 732 of the backside cap 730. For example, if thermal stress causes the backside cap 730 to expand in along the X axis, that stress will not directly couple to the island 740.

The backside cap 730 defines a backside cavity 735 (corresponding to cavity 353 in FIG. 3A, for example) between the back surface 706 and an inside surface 731 of the backside cap 730, to further physically isolate the island 740 from stresses of the backside cap 730. In some embodiments, there is no physical coupling directly between the cap 730 and the island 740. In other embodiments, one or more optional pillars 736 may extend between the inner surface 731 of the backside cap 730 and back surface 706 of the wafer 700, to provide support for the island 740 from the backside cap and contribute to defining and maintaining the backside cavity 735. In some embodiments, the pillar or pillars 736 may be an integral part of the backside cap 730.

At step 606, the method 600 removes the oxide at oxide region 713, by methods and processes known in the art. Removal of the top oxide layer 713 releases the MEMS structure (e.g., 771, 772) so that those structures are subsequently moveable with respect to the wafer 700.

A top cap 790 is bonded to the wafer 700 at step 607, to seal the device. The top cap 790 does not have physical contact with the island 740, but is coupled to the wafer 700 so as to circumscribe the gap 781.

The top cap 790 may be electrically conductive, and may be silicon for example, and may be bonded to the substrate 700 through metal-to-metal bonding. In some embodiments, the cap 790 may be a part of a cap wafer of similar dimensions to the wafer 700. Such a cap wafer may have many cap sections, each cap section corresponding to a device on the wafer 700 to be capped. The outer periphery 791 of the top cap 790 may be thinner (e.g., in the Z axis as schematically illustrated in FIG. 7F) than other portions of the cap 790 to facilitate dicing, or grinding to open.

Figure 7F:
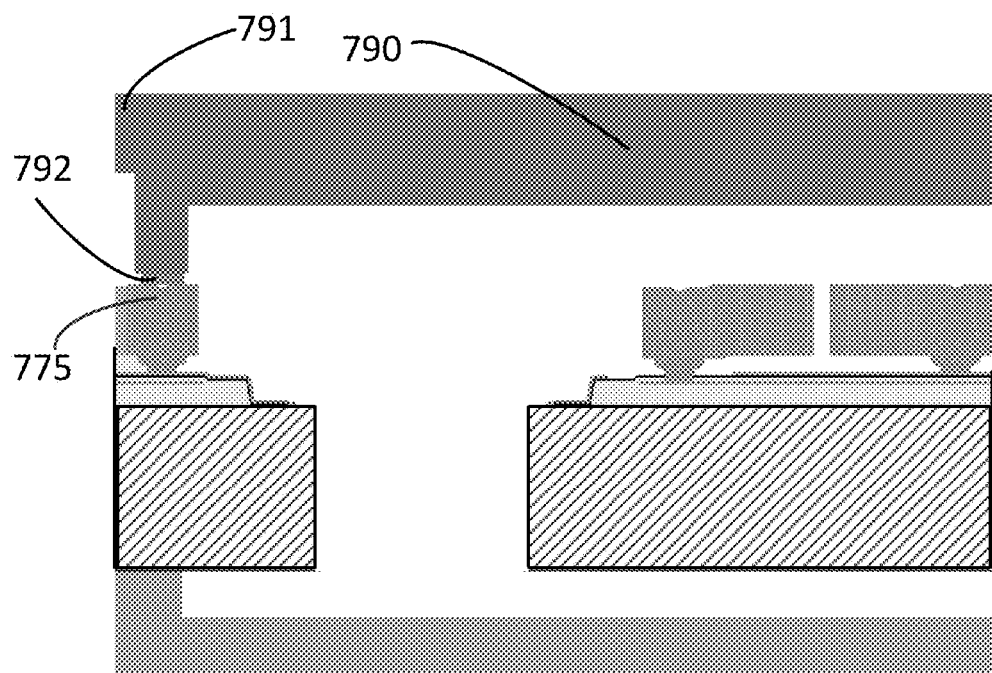

In the embodiment of FIG. 7F, the top cap 790 is bonded to the wall 775. The top cap 790 may be bonded to the wafer 770 or wall 775 in a variety of ways known in the art. In FIG. 7F, for example, the top cap 790 is bonded to the wall 775 by an eutectic metal bond 792, such as an AL-GE bond for example.

Finally, as step 608, the wafer and its caps are diced to into individual, capped MEMS devices.

Figure 6B:
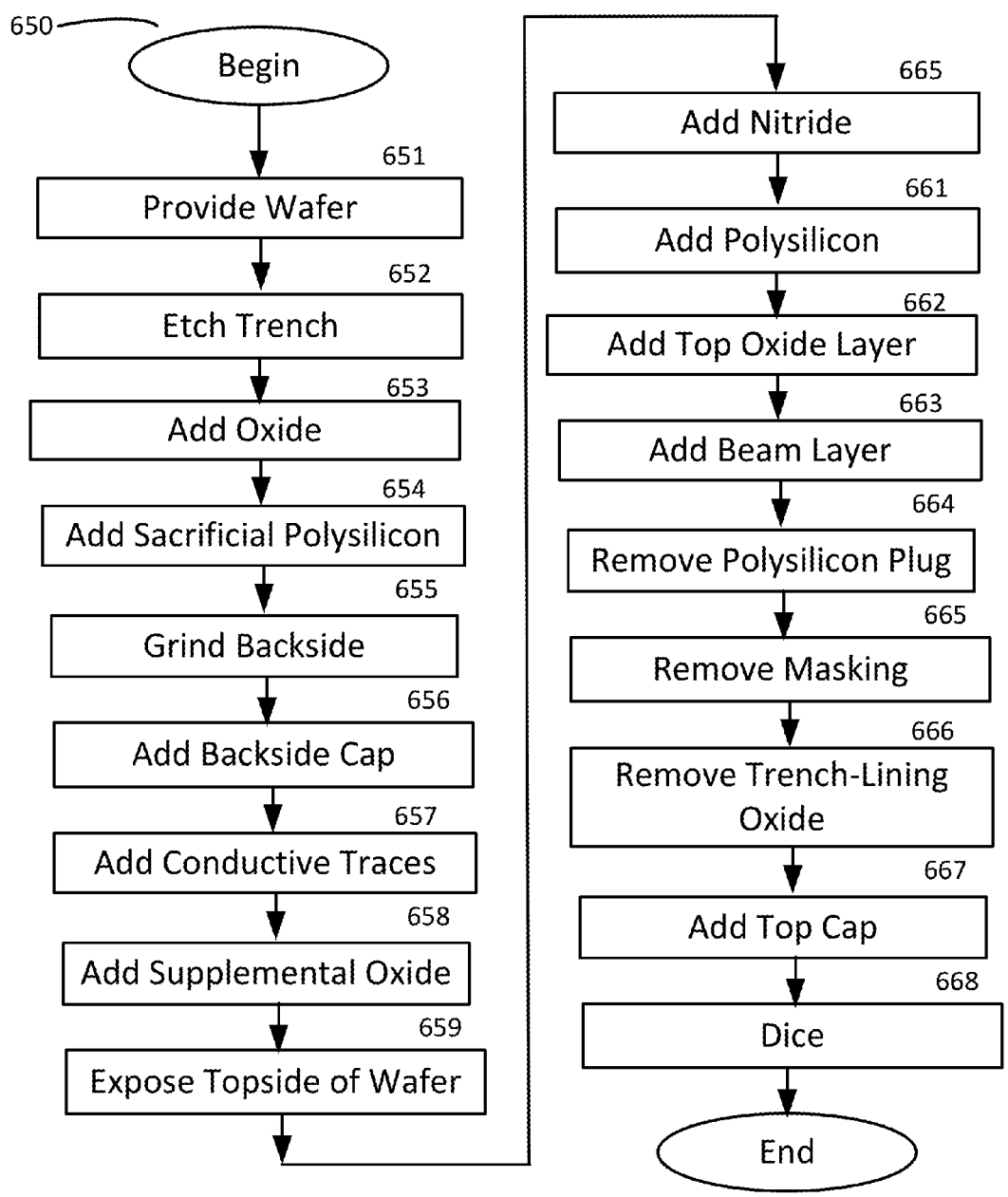
FIG. 6B is a flow chart of another embodiment of a method of fabricating a MEMS product.
Figure 8A:
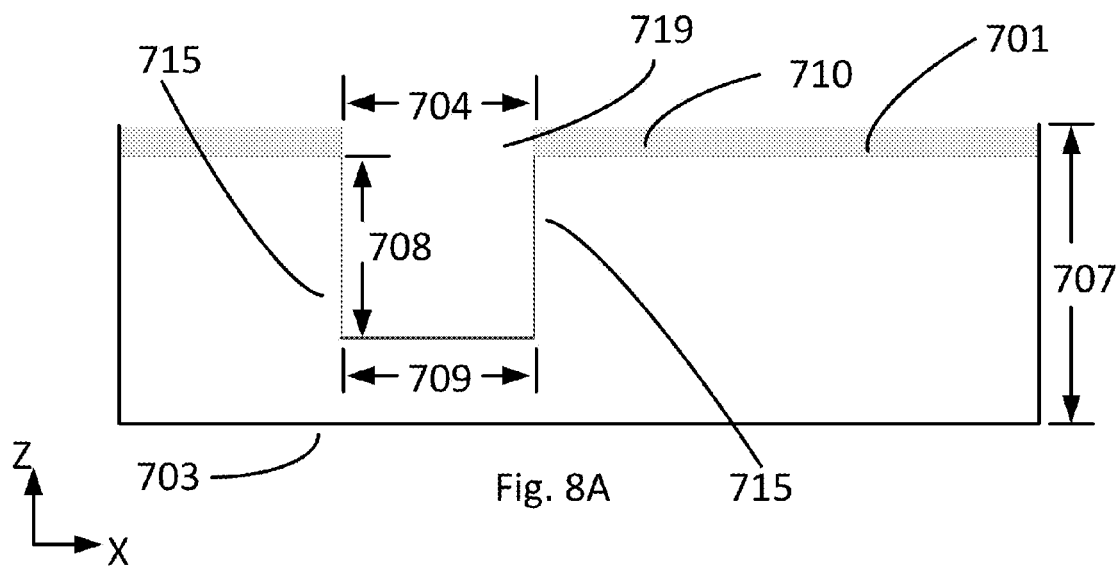
FIGS. 8A-8P schematically illustrates a MEMS device at various stages of fabrication according to the method of FIG. 6B.
Figure 8B:
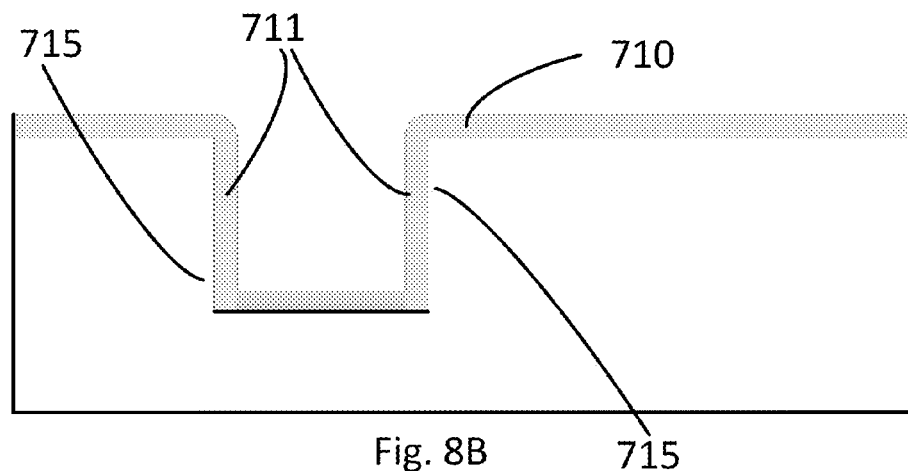
Figure 8C:
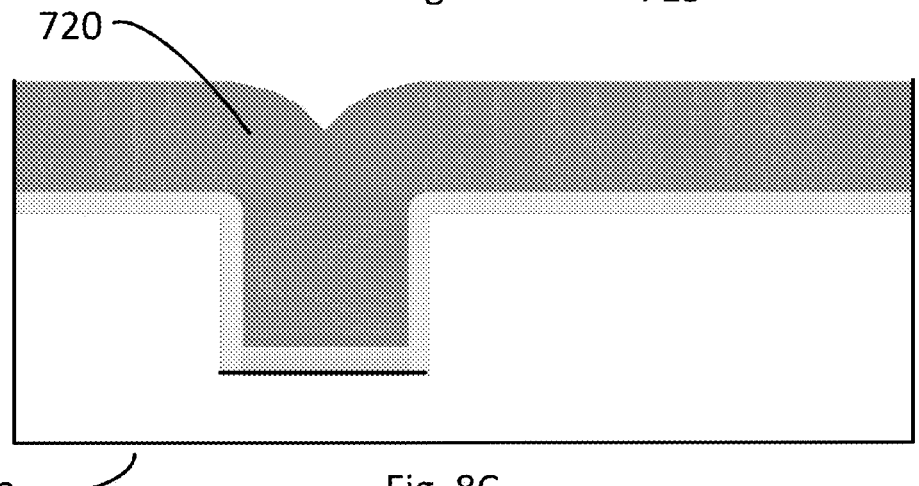
Figure 8G:
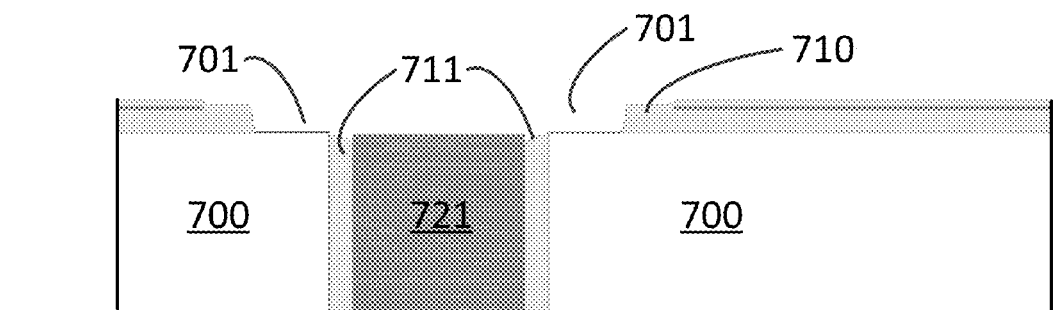
Figure 8H:
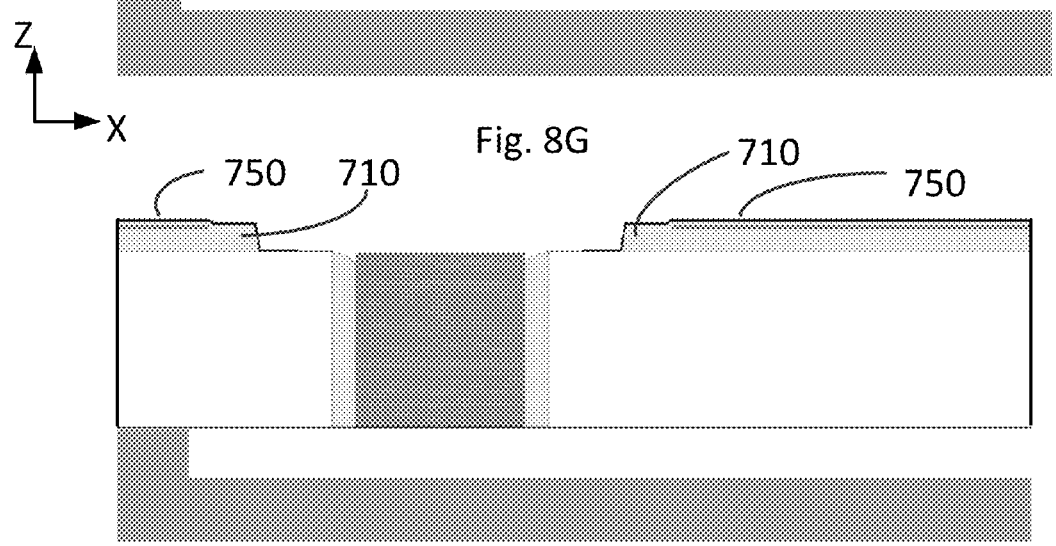
Figure 8I:
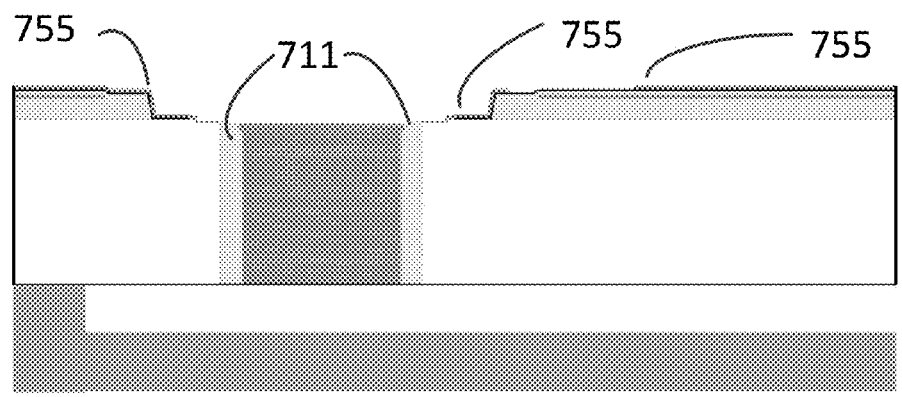
Figure 8J:
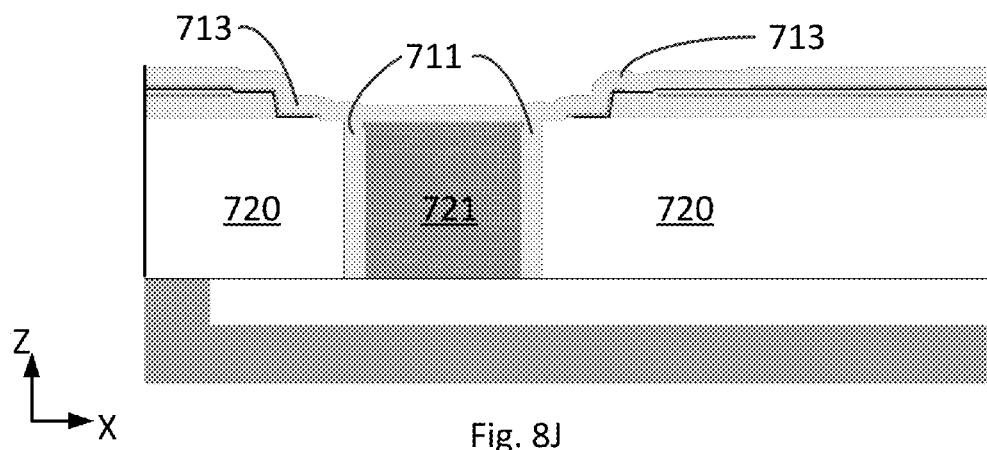
Figure 8K:
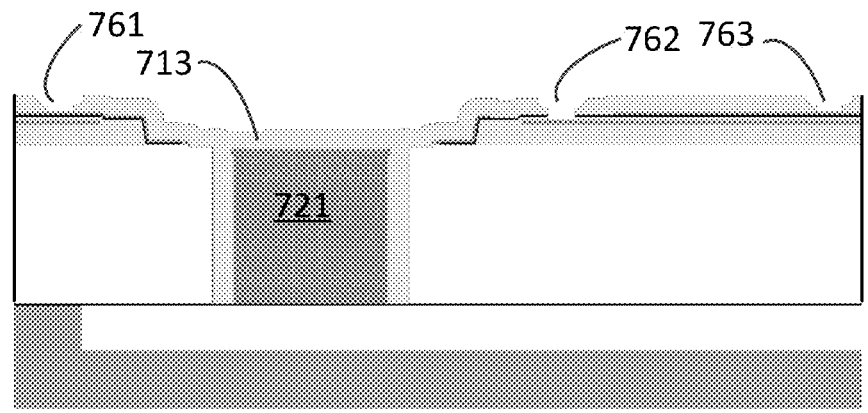
Figure 8L:
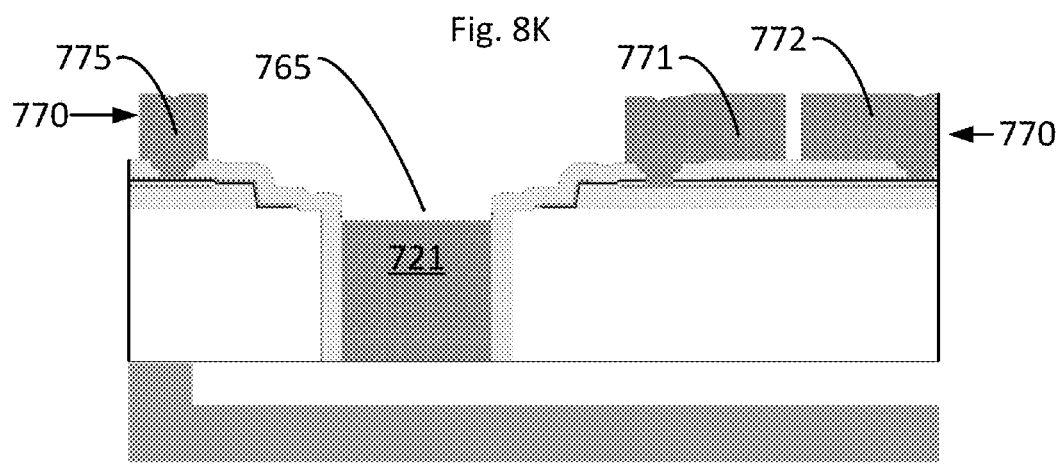
Figure 8M:
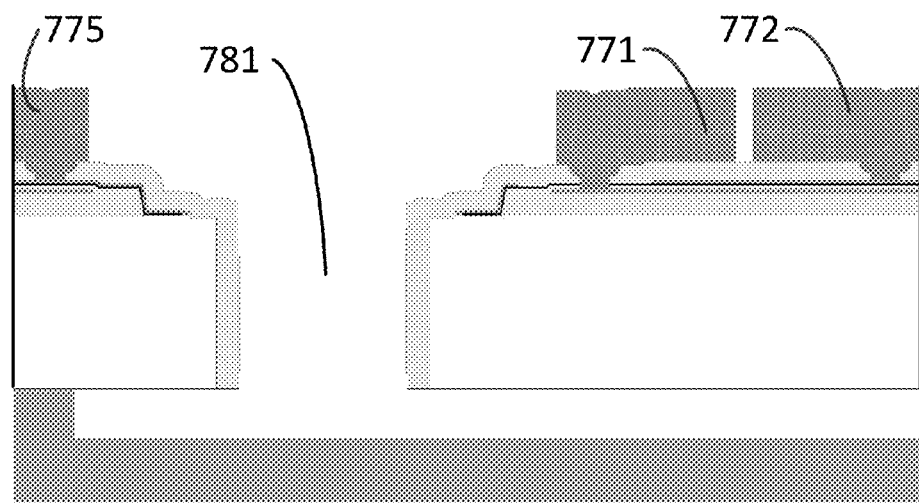
Figure 8N:
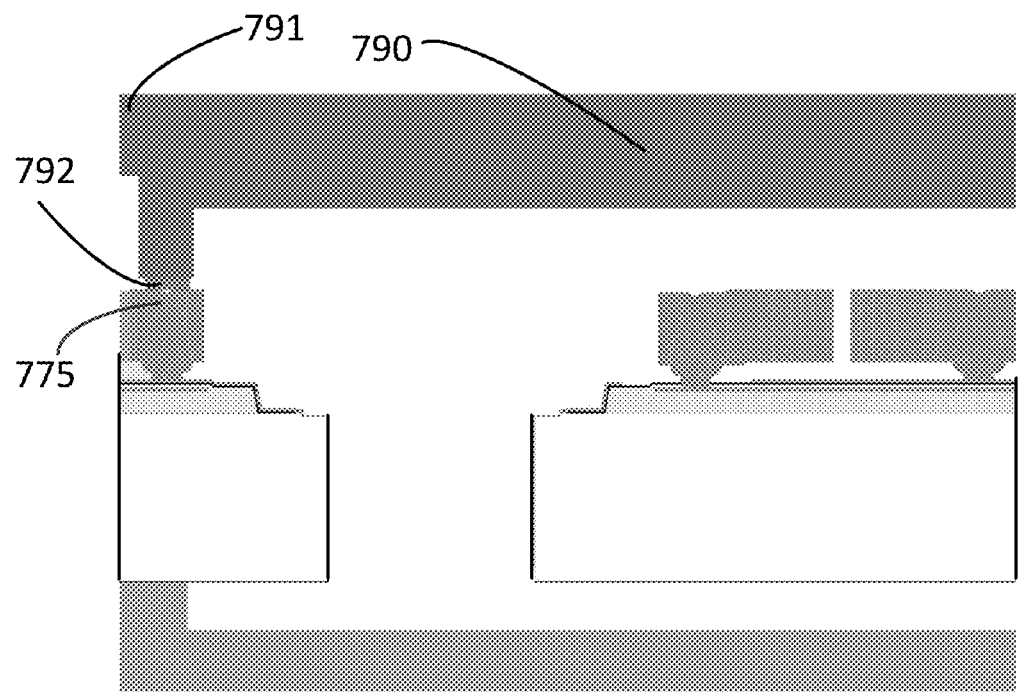
Figure 8O:
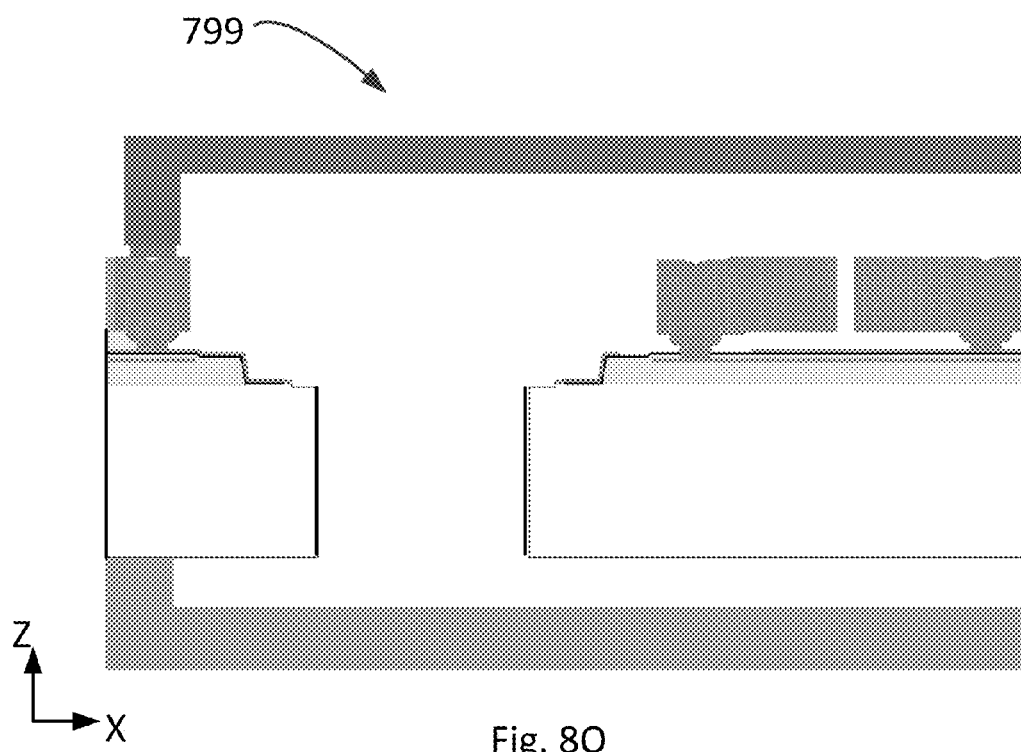
Figure 8P:
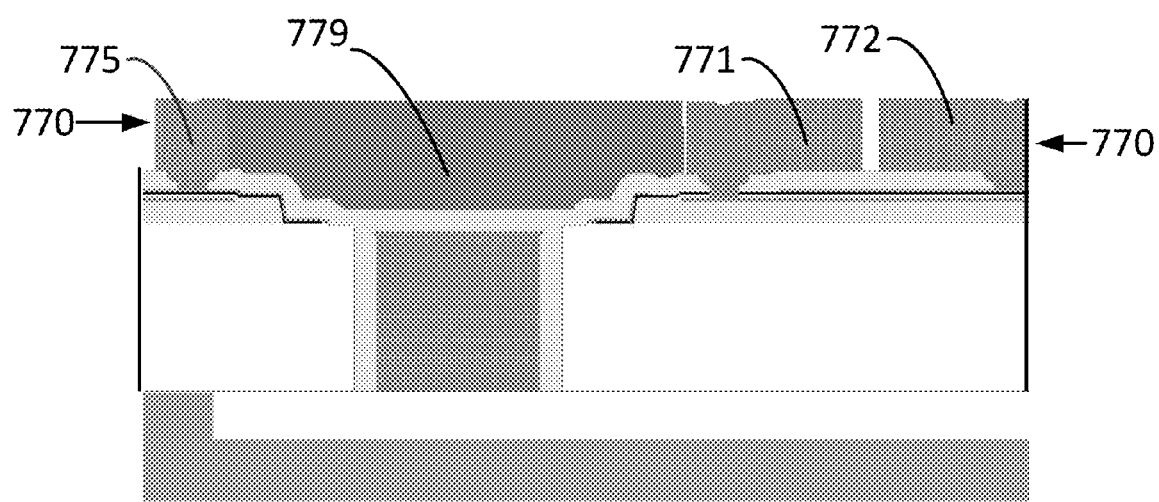

An alternate embodiment of a method 650 of fabricating a chip or wafer with a stress-relief trench is illustrated in FIG. 6B, and partial views of a device 799 at various stages of fabrication are schematically illustrated in FIGS. 8A-8P. The views in FIGS. 8A-8P show only one end of a MEMS device 799. Although method 650 and FIGS. 8A-8P schematically illustrate fabrication of MEMS device 799 on a silicon wafer 700, a person of ordinary skill in the art would be able to adapt the steps of method 650 to the fabrication of a MEMS device using an SOI wafer, for example by fabricating a MEMS island (e.g., MEMS island 740) as with the wafer 700 below.

The method 650 begins at step 651 with the provision of a wafer 700, which may be similar to wafer 311, and may be a silicon wafer as known in the art, for example. The wafer may have a thickness 707 of 780 microns, for example. In FIG. 8A, only a portion of the wafer 700 is shown. More specifically, the portion schematically illustrated in FIG. 8A is only a part of a MEMS device, and the wafer 700 includes many other identical MEMS devices.

At step 652, a trench 705 is etched into the top surface 701 of the wafer 700. In some embodiments, the trench 705 has a depth 708 more than half of the thickness of the wafer 700, but less than the total thickness 707 of the wafer 700. For example, in the embodiment of FIG. 8A, the wafer 700 has a thickness 707 of about 780 microns, and the depth 708 of the trench 705 is approximately 500 microns. The trench 705 circumscribes a portion of the wafer 700 to form a MEMS island 740, as illustrated for example in the way that stress-relief gap 340 circumscribes MEMS platform 310 in FIG. 3B. The trench 705 is not continuous, in that some portions of the wafer 700 are left to span between the island 740 and the remaining portions of the wafer 700. Such remaining portions form bridges, such as bridges 330 in FIG. 3B, for example.

To etch the trench 705, a layer of oxide 710 approximately 2 microns thick may be grown on the top surface 702 of the wafer 700, and then patterned to provide an opening 719 in the desired location of the trench 705. The opening 719 in the oxide 710 may have a width 704 of about 20 microns, for example. Then the trench 705 may be etched by, for example, deep reactive-ion etching ("DRIE") through the opening 719. The trench 705 will have a width 709 approximately equal to the width 704 of the opening 719.

At step 653, additional oxide 711 is grown on the walls 715 of the trench 705 to line the trench 705, as schematically illustrated in FIG. 8B. The additional oxide 711 may be about 2 microns thick, and may effectively merge with the initial oxide layer 710 to become a contiguous part of oxide layer 710. As used herein, to "line" the trench 705 means to apply a thin layer of oxide to the walls 715 of the trench, but without filling the trench 705. In other words, the lined trench 705 is still a trench in the wafer 700 having a width 704 of approximately 16 microns.

Next, a layer of sacrificial polysilicon 720 is deposited on the oxide layer 710 at step 654, to cover the wafer 700 and fill the trench 705. As schematically illustrated in FIG. 8C the layer of sacrificial polysilicon 720 may be approximately 10 microns thick. The sacrificial polysilicon 720 is then etched at step 655 to remove the sacrificial polysilicon 720 over the top side 701 of the wafer, but leave the sacrificial polysilicon 720 filling the trench 705, as schematically illustrated in FIG. 8D. That body of remaining sacrificial polysilicon 720 filling the trench 705 may be referred to as the "plug" 721.

Next the process 650 turns to the backside 703 of the wafer 700. At step 655, the wafer 700 is flipped and the backside 703 of the wafer 700 is ground. The grinding at step 655 reduces the thickness 707 of the wafer 700 to expose the sacrificial polysilicon 720 in the trench 705 at the backside of the wafer 700, as schematically illustrated in FIG. 8D. In the present embodiment, since the wafer 700 is approximately 780 microns thick, and the trench 705 is approximately 500 microns deep, extending from the topside 701 of the wafer, the grind at step 655 removes at least 280 microns of wafer (i.e., 780 microns initial thickness–280 microns removed by grinding=500 microns residual wafer thickness) to expose the sacrificial polysilicon 720. The grinding 655 leaves an exposed back surface 706 of the wafer 700, except where the polysilicon 720 and trench-lining oxide 711 are exposed.

Next, step 656 bonds a backside cap 730 to back surface 706 of the wafer 700. The cap 730 may be silicon, and may be bonded to the wafer 730 by a silicon-silicon fusion bond, or by a metal-metal bond, such as an Au—Au bond or a GE-AL bond, as known in the art.

The backside cap 730 may be hermetically sealed to the back surface 706 around the periphery 732 of the backside cap 730. The periphery 732 of the backside cap 730 circumscribes the island 740, so that the island 740 will be physically isolated from physical stress from the periphery 732 of the backside cap 730, after the sacrificial polysilicon 720 is removed (described below). For example, if thermal stress causes the backside cap 730 to expand in along the X axis, that stress will not directly couple to the island 740.

The backside cap 730 defines a backside cavity 735 (corresponding to cavity 353 in FIG. 3A, for example) between the back surface 706 and an inside surface 731 of the backside cap 730, to further physically isolate the island 740 from stresses of the backside cap 730. In some embodiments, there is no physical coupling directly between the cap 730 and the island 740. In other embodiments, one or more optional pillars 736 may extend between the inner surface 731 of the backside cap 730 and back surface 706 of the wafer 700, to provide support for the backside cap and contribute to defining and maintaining the backside cavity 735. In some embodiments, the pillar or pillars 736 may be an integral part of the backside cap 730. With the sensor substrate 700 supported by the pillars 736, the bridges 330 could be omitted or removed.

Returning to the top side of the wafer, conductive routing traces 745 are deposited on the oxide layer 710 at step 657. Such traces 745 are schematically illustrated in FIG. 8E, and may be polysilicon or metal, to name but a few examples.

An additional layer of oxide 712 is added at step 658, to cover the traces 745, as schematically illustrated in FIG. 8F. The additional layer of oxide 712 also covers the top of the polysilicon plug 721, and integrates with and becomes a part of polysilicon layer 710. The additional layer of oxide 712 may protect the traces 745 during subsequent fabrication steps.

At step 659, some of the oxide 710 (which includes some of the oxide 712) is removed to expose some of the top side 701 of the wafer 700 around the trench 705, as schematically illustrated in FIG. 8G. As such, the oxide 711 lining the trench 705 is no longer integrated with the oxide layer 710 and additional oxide layer 712. Next, at step 660, a layer of nitride 750 is added to cover the oxide layer 710 and at least a portion of the exposed top surface 701 of the wafer 700, as schematically illustrated in FIG. 8H. The nitride layer 750 is approximately 1200 angstroms thick, and seals and passivates the oxide 710.

Another, second, layer of polysilicon 755 is added at step 661, to further protect the oxide 710 and the inter-poly 750. An embodiment of the second polysilicon layer 755 is schematically illustrated in FIG. 8I. The second polysilicon layer 755 may be conductive and may also provide electrical interconnections between features of the device.

A top layer of oxide 713, as schematically illustrated in FIG. 8J, is added at step 662, and covers the second polysilicon layer 755, any exposed portions of the inter-poly nitride layer 750, as well as any exposed portions of the top surface 701 of the wafer 700, and the polysilicon plug 721. The top layer of oxide 713 may integrate with the trench-lining oxide 711. However, the top oxide layer 713 does not integrate with the initial oxide layer 710, or the later oxide layer 712, because those layers are now isolated by one or more of the inter-poly nitride layer 750 and the second polysilicon layer 755.

At step 662, one or more anchor passages 761, 762 and 763, are etched through the top oxide layer 713 to an underlying polysilicon layer, such as portions of polysilicon layers 745 and 755, as schematically illustrated in FIG. 8K. The anchor passages 761, 762 and 763 provide access for physical and electrical connections between to those portions of polysilicon layers 745 and 755 and MEMS structures described below.

Next, at step 663, a beam layer 770 of polysilicon is deposited on the top oxide layer 713, as schematically illustrated in FIG. 8L. The beam layer 770 may be 8 to 16 microns thick, and initially covers the top oxide layer 713, and fills the passages 761, 762, and 763, to couple to the polysilicon layers 745 and 755. The beam layer is patterned to form MEMS structures (e.g., 771, 772) and an outer wall 775 that circumscribes the trench 705.

To form a jumper that spans a gap, such as jumper 352 in FIG. 3B for example, some embodiments pattern the beam layer 770 to leave a polysilicon span 779 across the trench 705, as schematically illustrated in FIG. 8P, for example. The polysilicon span 779 will remain after the polysilicon plug 721, and the polysilicon in the release aperture 765, and the portion of the top oxide layer 713 are removed, as described below. The polysilicon span 779 will be protected and will not be etched away during the subsequent polysilicon plug 721 etching steps. The jumper 352 formed from the polysilicon span 779 may electrically couple to a MEMS structure (e.g., 771) or to trace 745 for example.

The polysilicon plug 721 is removed at step 664 by masking all other portions of polysilicon on top oxide layer 713, for example with a photo resist, and etching an aperture 765 through the oxide layer 710 to expose the polysilicon plug 721. The polysilicon plug is then etched away, by application of xenon di-fluoride, for example. The etching removes the polysilicon plug 721, leaving the gap 781 between the island 740 and the body of the wafer 700, as schematically illustrated in FIG. 8M. At this point, the island 340 is suspended from, and moveable with respect to, the rest of the wafer 700, and may be described as a MEMS platform, as MEMS platform 310 in FIG. 3A.

The MEMS structures 771, 772 and outer wall 775 are not etched by this step. After step 664, the masking layer is removed at step 665.

At step 666, the trench-lining oxide 711 is removed, as well as the top oxide layer 713, by methods and processes known in the art, such as vapor HF etching. Removal of the top oxide layer 713 releases the MEMS structure (e.g., 771, 772) so that those structures are subsequently moveable with respect to the wafer 700.

A top cap 790 is bonded to the wafer 700 at step 667, to seal the device. The top cap 790 does not have physical contact with the island 740, but is coupled to the wafer 700 so as to circumscribe the gap 781, as described in connection with peripheral region 360, above.

The top cap 790 may be electrically conductive, and may be metal or silicon for example. In some embodiments, the cap 790 may be a part of a cap wafer of similar dimensions to the wafer 700. Such a cap wafer may have many cap sections, each cap section corresponding to a device on the wafer 700 to be capped. The outer periphery 791 of the top cap 790 may be thinner (e.g., in the Z axis as schematically illustrated in FIG. 8N) than other portions of the cap 790 to facilitate dicing.

In the embodiment of FIG. 8N, the top cap 790 is bonded to the wall 775. The top cap 790 may be bonded to the wafer 770 or wall 775 in a variety of ways known in the art. In FIG. 8N, for example, the top cap 790 is bonded to the wall 775 by a eutectic metal bond 792, such as an AL-GE bond for example.

Finally, as step 668, the wafer and its caps are diced to into individual, capped MEMS devices. Such a device 799 is schematically illustrated in FIG. 8O, for example.

In an alternate embodiment, the MEMS platform 310 is suspended within the substrate 311 without bridges 330, but by one or more pillars 736. Such an embodiment may be schematically illustrated by FIG. 8D for example. Such an embodiment may be fabricated according to the process 650 of FIG. 6A, except that the etching of the trench (e.g., at step 652) does not form bridges 330.

Figure 7G:
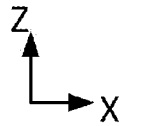
Figure 7G:
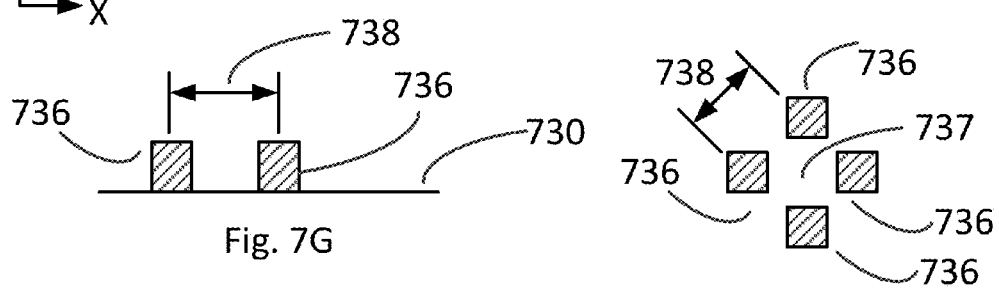
Figure 7H:
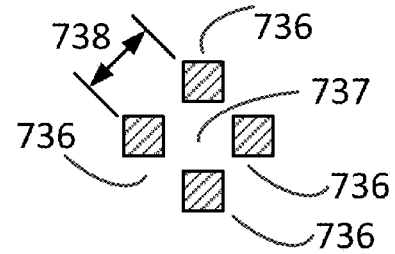

In some embodiments, the pillar 736 may be a cluster of two or more pillars disposed near the center 737 of MEMS platform 310, as schematically illustrated in FIG. 7G and FIG. 7H, for example. In an embodiment having a cluster of pillars 736, the distance 738 between the pillars may be small, such as less than five percent of the length of the shortest edge of the MEMS platform 310. In such an embodiment, thermal expansion of the MEMS platform 310 or cap 730 will have a reduced effect on the movement of the pillars 736 in the cluster because the distance between them is relatively small, and so the opportunity for expansion (e.g., along the X axis) is correspondingly small.

Figure 9:
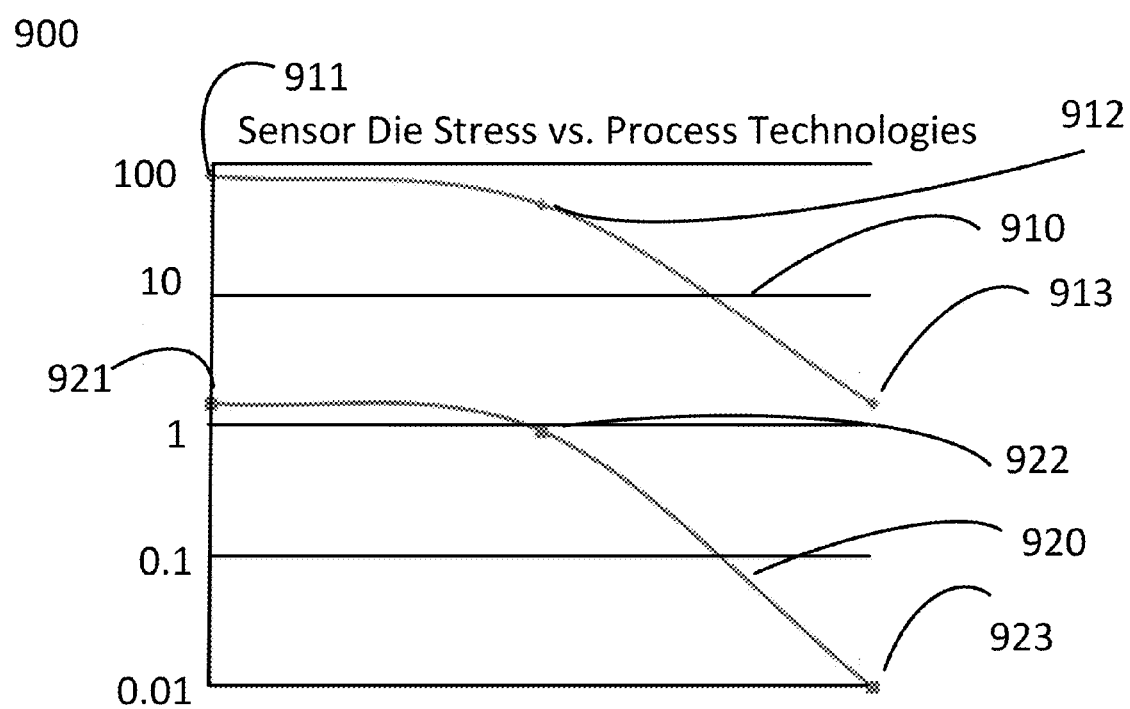
FIG. 9 is a graph schematically illustrating die stress among several packaging technologies.

The inventors have discovered that MEMS products having a stress-isolated MEMS platform, as described above, show a marked improvement in die stress, as shown in the graph 900 in FIG. 9, in which the horizontal axis describes process technologies and the vertical axis is logarithmic, and shows die stress in MPa over a temperature range of 165 degrees centigrade.

Points along the upper curve 910 indicate die stress in a MEMS product encapsulated in an overmold package. Point 911 shows a die stress of almost 100 MPa for a MEMS device in an overmold package. Point 912 shows a die stress of somewhat less than 100 MPa for a similar MEMS device having 100 micrometer-deep stress-relief trench, where a trench—unlike a stress-relief gap 340 described herein—does not extend all the way through the substrate. Point 913 shows a die stress of slightly more than one MPa for a MEMS product having a stress-relief gap 340, such as those described above for example. As shown, the stress-relief gap provides substantially more relief from die stress than the prior art technologies.

Points along lower curve 920 indicate die stress in a MEMS product in a cavity package. Point 921 shows a die stress of slightly more than 1 MPa for a MEMS device in a cavity package. Point 922 shows a die stress of somewhat less than 1 for a similar MEMS device having 100 micrometer-deep stress-relief trench, where a trench—unlike a stress-relief gap 340 described herein—does not extend all the way through the substrate. Point 923 shows a die stress of about 0.01 MPa for a MEMS product having a stress-relief gap 340, such as those described above for example. As shown, the stress-relief gap provides substantially more relief from die stress than the prior art technologies.

Various embodiments of the present invention may be characterized by the potential claims listed in the paragraphs following this paragraph (and before the actual claims provided at the end of this application). These potential claims form a part of the written description of this application. Accordingly, subject matter of the following potential claims may be presented as actual claims in later proceedings involving this application or any application claiming priority based on this application. Inclusion of such potential claims should not be construed to mean that the actual claims do not cover the subject matter of the potential claims. Thus, a decision to not present these potential claims in later proceedings should not be construed as a donation of the subject matter to the public.

Without limitation, potential subject matter that may be claimed (prefaced with the letter "P" so as to avoid confusion with the actual claims presented below) includes:

P1. A MEMS device comprising:

a substrate layer comprising a substrate;

a MEMS platform within the substrate layer and defining a stress-relief gap between the MEMS platform and the substrate;

a MEMS structure movably suspended from the MEMS platform by at least one flexure, the at least one flexure having a flexure resonant frequency;

a plurality of bridges disposed between the substrate and the MEMS platform and spanning the stress-relief gap between the substrate and the MEMS platform, each of the plurality of bridges having a bridge resonant frequency, the flexure resonant frequency having a ratio to the bridge resonant frequency of at least 25:1 such that the bridges are configured to rigidly suspend the MEMS platform from the substrate; and at least one flexible electrically conductive jumper electrically coupled to the MEMS structure on the MEMS platform, and spanning the stress-relief gap between the substrate and the MEMS platform, the flexible electrically conductive jumper configured to carry an electrical signal across the stress-relief gap.

P10. A MEMS device comprising:

a substrate layer defining a substrate layer plane, and comprising a substrate and a MEMS platform within the substrate layer, the MEMS platform defining a stress-relief gap within the substrate layer between the MEMS platform and the substrate;

a MEMS layer defining a MEMS layer plane parallel to, but offset from, the substrate layer plane, the MEMS layer comprising a MEMS structure movably suspended from the MEMS platform by at least one flexure, the at least one flexure in the MEMS layer plane, the at least one flexure having a flexure resonant frequency;

a plurality of bridges within the substrate layer plane and disposed between the substrate and the MEMS platform and spanning the stress-relief gap between the substrate and the MEMS platform, each of the plurality of bridges having a bridge resonant frequency, the flexure resonant frequency having a ratio to the bridge resonant frequency of at least 25:1 such that the bridges are configured to rigidly suspend the MEMS platform from the substrate; and at least one flexible electrically conductive jumper electrically coupled to the MEMS structure on the MEMS platform, and spanning the stress-relief gap between the substrate and the MEMS platform, the flexible electrically conductive jumper configured to carry an electrical signal across the stress-relief gap.

P30. A MEMS device comprising:
a substrate layer comprising a substrate;
a MEMS platform within the substrate layer and defining a stress-relief gap between the MEMS platform and the substrate;
a MEMS structure movably suspended from the MEMS platform by at least one flexure;
at least one flexible electrically conductive jumper electrically coupled to the MEMS structure on the MEMS platform, and spanning the stress-relief gap between the substrate and the MEMS platform, the flexible electrically conductive jumper configured to carry an electrical signal across the stress-relief gap;
a bottom cap coupled to the substrate and defining a bottom void between the bottom cap and the MEMS base;
a top cap coupled to the substrate such that the MEMS base is disposed between the top cap and the bottom cap, and defining a top void between the top cap and the MEMS base; and
at least one pillar spanning a bottom stress-relief bap between the bottom cap and the MEMS platform.

The embodiments of the invention described above are intended to be merely exemplary; numerous variations and modifications will be apparent to those skilled in the art. All such variations and modifications are intended to be within the scope of the present invention as defined in any appended claims.

What is claimed is:

1. An apparatus comprising:
a MEMS structure on a substrate, the substrate including at least one trench passing through the substrate to relieve stress on the MEMS structure and defining a MEMS platform and a peripheral region, wherein the MEMS structure is disposed on the MEMS platform; and
at least one flexible electrical conductor electrically coupled to the MEMS structure, spanning the at least one trench in the substrate, and physically contacting the peripheral region of the substrate and the MEMS platform, wherein the at least one flexible electrical conductor is configured to carry an electrical signal across the at least one trench and configured to flex in response to movement on either side of the at least one trench.

2. The apparatus of claim 1, further comprising a top cap coupled to the substrate creating a seal and enclosing the MEMS structure.

3. The apparatus of claim 1, wherein the apparatus further comprises at least one bridge physically coupling the peripheral region of the substrate and the MEMS platform.

4. The apparatus of claim 3, wherein the at least one bridge comprises a plurality of bridges disposed between the peripheral region of the substrate and the MEMS platform.

5. The apparatus of claim 3, wherein at least one bridge is a Z-shaped bridge, an L-shaped bridge, or a U-shaped bridge.

6. The apparatus of claim 1, wherein the at least one flexible electrical conductor comprises a jumper.

7. The apparatus of claim 1, wherein the at least one flexible electrical conductor comprises an electrical conductor on at least one bridge, the electrical conductor electrically coupled to the MEMS structure.

8. The apparatus of claim 1, further comprising at least one pillar spanning a stress-relief gap and configured to rigidly suspend the MEMS platform within the substrate.

9. The apparatus of claim 1, further comprising:
a bottom cap coupled to the substrate; and
at least one pillar physically coupling the bottom cap to the MEMS platform.

10. The apparatus of claim 9, further comprising:
a top cap coupled to the substrate such that the MEMS platform is disposed between the top cap and the bottom cap, and defining a top void between the top cap and the MEMS platform.

11. A MEMS device comprising:
a substrate having a stress-relief gap therein defining a MEMS platform and a peripheral region;
a MEMS structure on the MEMS platform;
suspension means for rigidly suspending the MEMS platform within the substrate; and
electrical conductor means spanning the stress-relief gap, physically contacting the peripheral region of the substrate and the MEMS platform, and configured to carry an electrical signal across the stress-relief gap.

12. The MEMS device of claim 11, wherein
the peripheral region circumscribes the stress-relief gap, and the MEMS device further comprises:
a bottom cap coupled to the peripheral region and defining a bottom void between the bottom cap and the MEMS platform; and
a top cap, coupled to the substrate such that the MEMS platform is disposed between the top cap and the bottom cap, and defining a top void between the top cap and the MEMS platform.

13. The MEMS device of claim 12, wherein the suspension means comprise at least one pedestal extending between the bottom cap and the MEMS platform.

14. The MEMS device of claim 11, wherein the suspension means comprise a plurality of bridges, each of the plurality of bridges comprising:
a first segment extending from the substrate in the direction of the MEMS platform;
a second segment extending from, and disposed at an angle to, the first segment; and
a third segment extending from, and disposed at an angle to, the second segment, and coupled to the MEMS platform.

15. The MEMS device of claim 11, wherein the suspension means comprise a plurality of bridges, and wherein at least one of the plurality of bridges is a Z-shaped bridge, an L-shaped bridge or a U-shaped bridge.

16. The MEMS device of claim 11, wherein the electrical conductor means comprise at least one conductive jumper spanning the stress-relief gap, the at least one conductive jumper electrically coupled to the MEMS structure.

17. The MEMS device of claim 11, wherein the suspension means and the electrical conductor means comprise an electrical conductor on at least one bridge, the electrical conductor electrically coupled to the MEMS structure.

18. A MEMS device comprising:
a substrate having a stress-relief gap therein defining a MEMS platform and a peripheral region;
a MEMS structure on the MEMS platform; and
at least one flexible electrical conductor electrically coupled to the MEMS structure on the MEMS platform, spanning the stress-relief gap, and physically contacting the peripheral region of the substrate and the MEMS platform, the at least one flexible electrical conductor configured to carry an electrical signal across the stress-relief gap.

19. The MEMS device of claim 18, further comprising:
a bottom cap coupled to the substrate and defining a bottom void between the bottom cap and the MEMS platform; and at least one pillar physically coupled to the bottom cap and the MEMS platform, and configured to support the MEMS platform without bridges spanning the stress-relief gap.

20. The MEMS device of claim 19, further comprising:
a top cap coupled to the substrate such that the MEMS platform is disposed between the top cap and the bottom cap, and defining a top void between the top cap and the MEMS platform.

* * * * *